(12) United States Patent
Jeon

(10) Patent No.: US 11,443,659 B2
(45) Date of Patent: Sep. 13, 2022

(54) DISPLAY APPARATUS AND METHOD OF MANUFACTURING THE SAME

(71) Applicant: Samsung Display Co., Ltd., Yongin-si (KR)

(72) Inventor: Myoung-Ha Jeon, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/115,961

(22) Filed: Dec. 9, 2020

(65) Prior Publication Data
US 2021/0183274 A1 Jun. 17, 2021

(30) Foreign Application Priority Data
Dec. 12, 2019 (KR) .................. 10-2019-0165370

(51) Int. Cl.
| H05K 1/18 | (2006.01) |
| G09F 9/30 | (2006.01) |
| H01L 51/56 | (2006.01) |
| H05K 1/02 | (2006.01) |
| H01L 51/52 | (2006.01) |

(52) U.S. Cl.
CPC .......... *G09F 9/301* (2013.01); *H01L 51/5293* (2013.01); *H01L 51/56* (2013.01); *H05K 1/028* (2013.01); *H05K 1/189* (2013.01); *H05K 2201/10128* (2013.01)

(58) Field of Classification Search
CPC ..... G09F 9/301; H01L 51/5293; H01L 51/56; H05K 1/028; H05K 1/189; H05K 2201/10128
USPC ...................................... 361/679.01
See application file for complete search history.

(56) References Cited

U.S. PATENT DOCUMENTS

| 6,525,718 | B1* | 2/2003 | Murakami | .......... G02F 1/13452 345/206 |
| 10,153,322 | B2* | 12/2018 | Kim | ..................... H01L 27/3225 |
| 10,609,821 | B2 | 3/2020 | Jeon et al. | |
| 2011/0255303 | A1* | 10/2011 | Nichol | ................. G02B 6/0018 362/606 |
| 2016/0179229 | A1* | 6/2016 | Ahn | ....................... G06F 3/0447 345/173 |
| 2018/0022013 | A1* | 1/2018 | Choi | ...................... B32B 37/12 156/196 |

* cited by examiner

*Primary Examiner* — Binh B Tran
(74) *Attorney, Agent, or Firm* — H.C. Park & Associates, PLC

(57) ABSTRACT

A display apparatus includes a flexible panel including a first non-bending area, a second non-bending area spaced apart from the first non-bending area, and a bending area between the first non-bending area and the second non-bending area, a circuit film having an opening at a first end of thereof and disposed on the second non-bending area of the flexible panel, an anisotropic conductive film disposed between the flexible panel and the circuit film, and a protective layer disposed on the bending area and covering at least a portion of the first end of the circuit film.

19 Claims, 24 Drawing Sheets

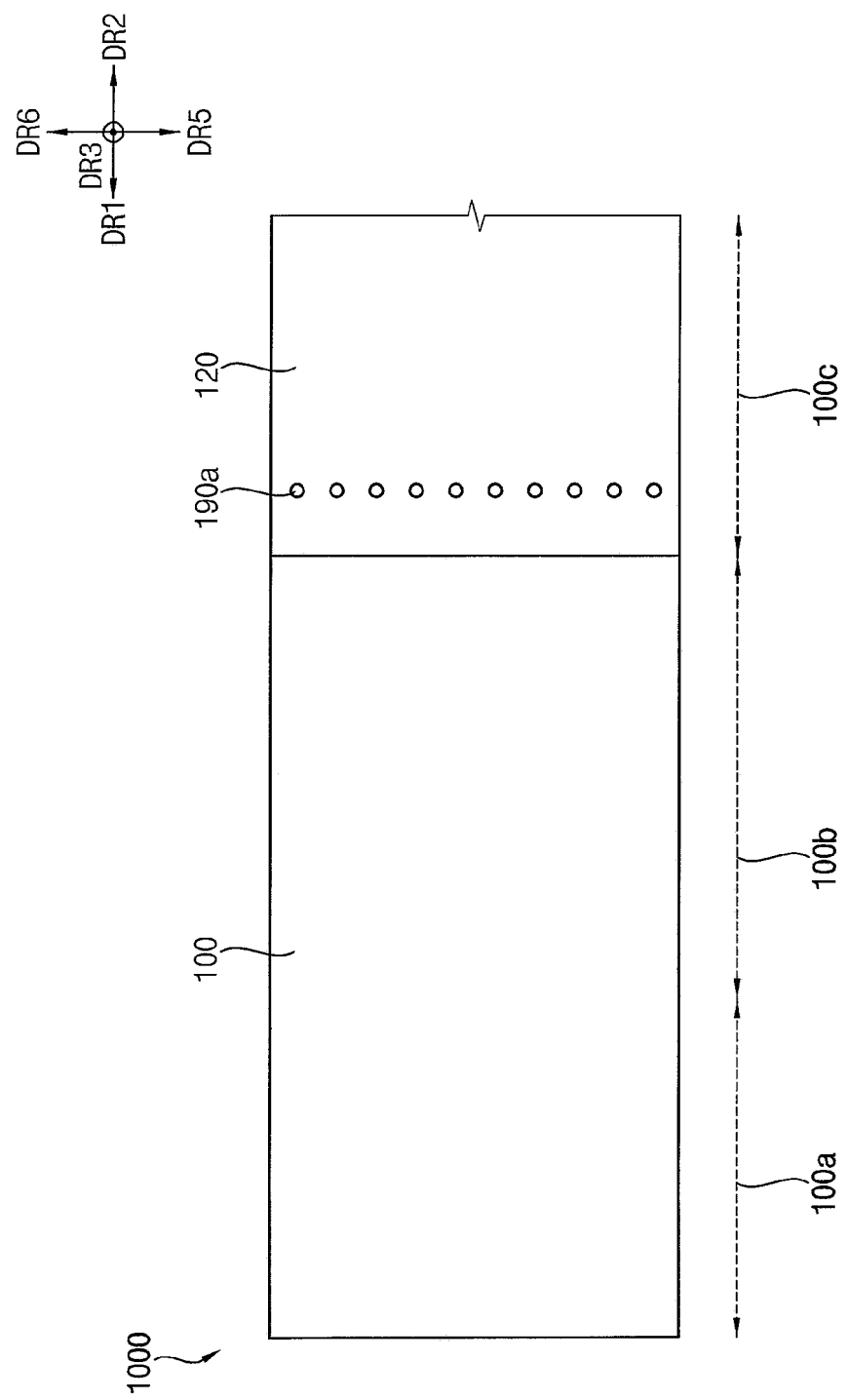

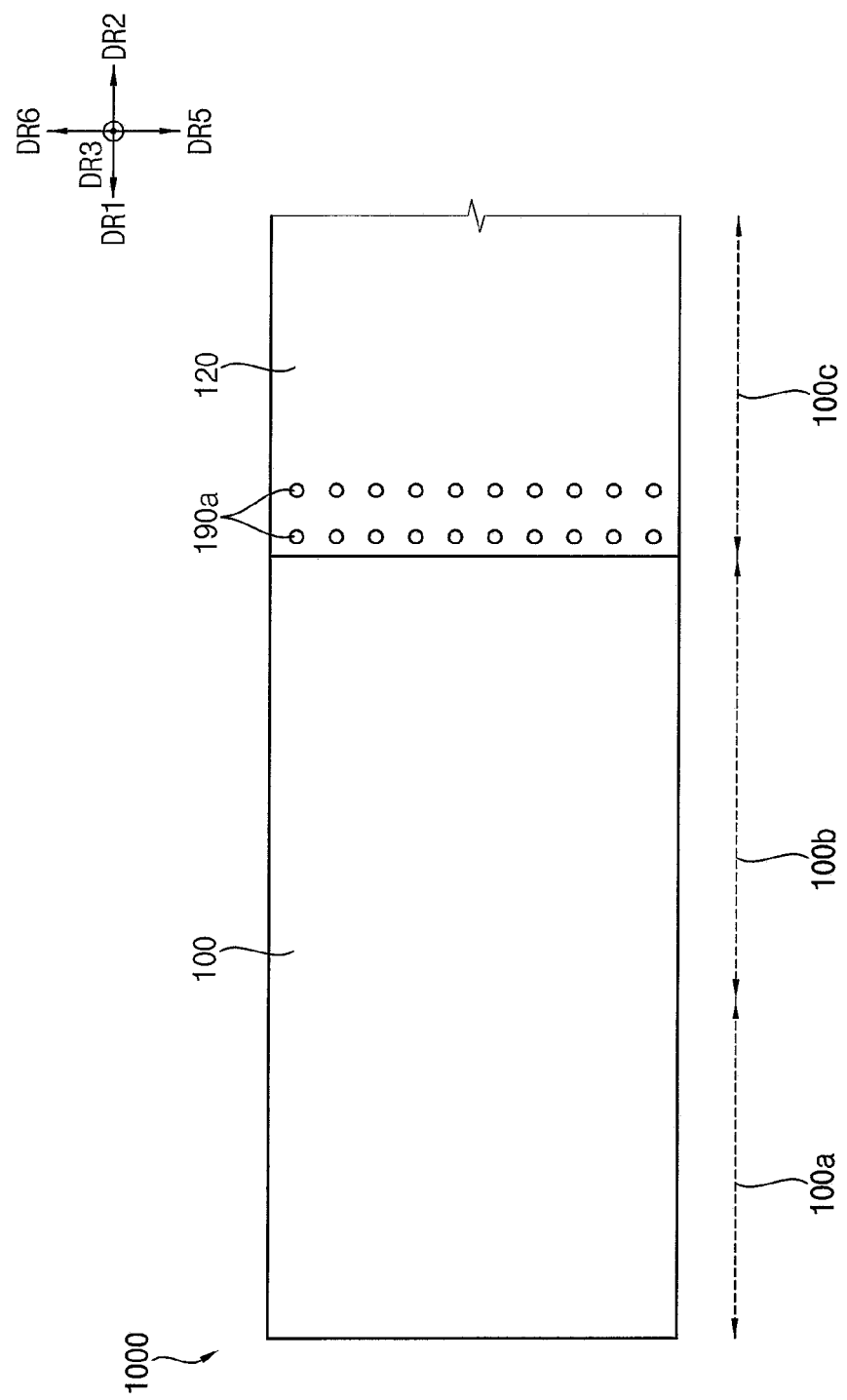

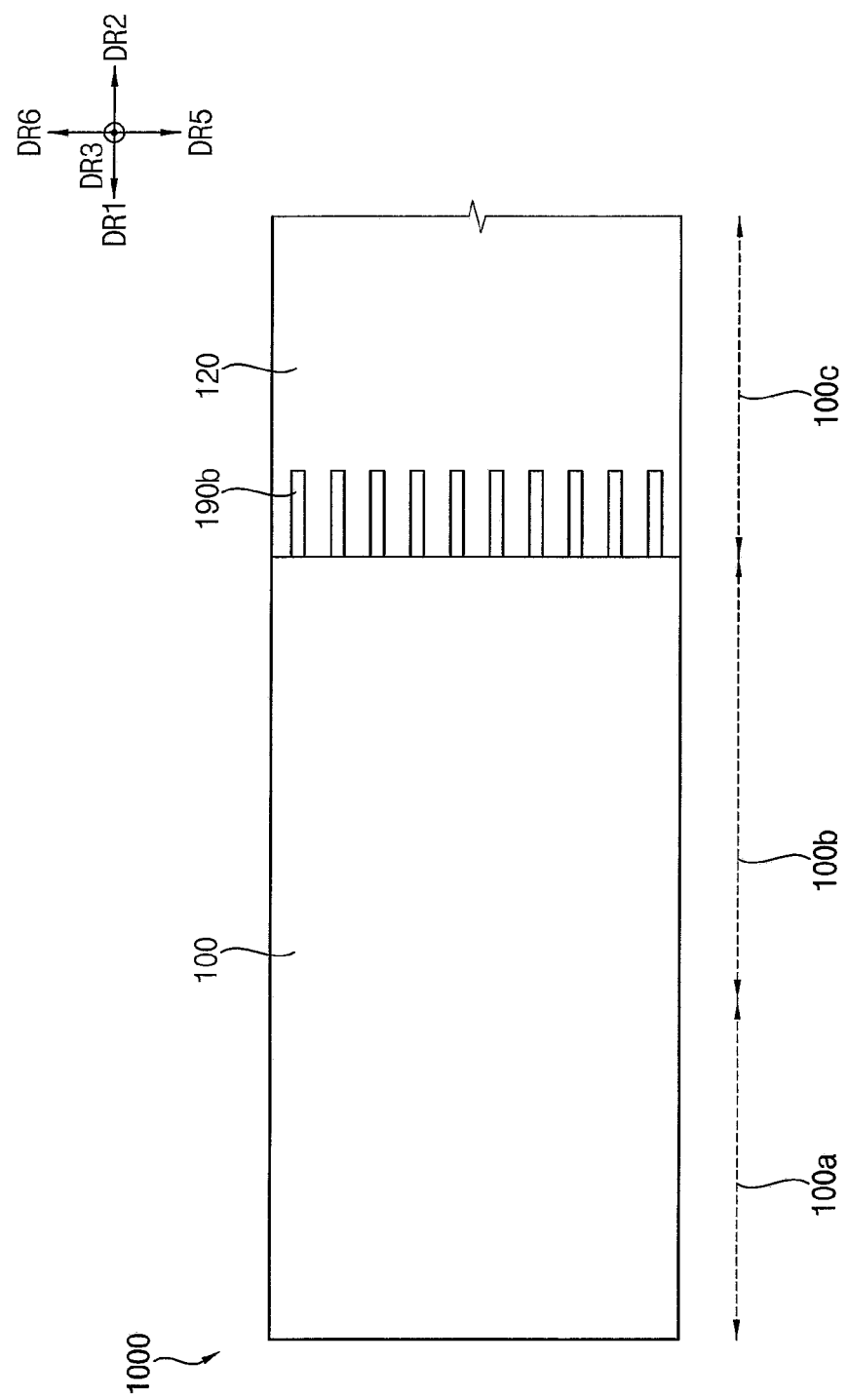

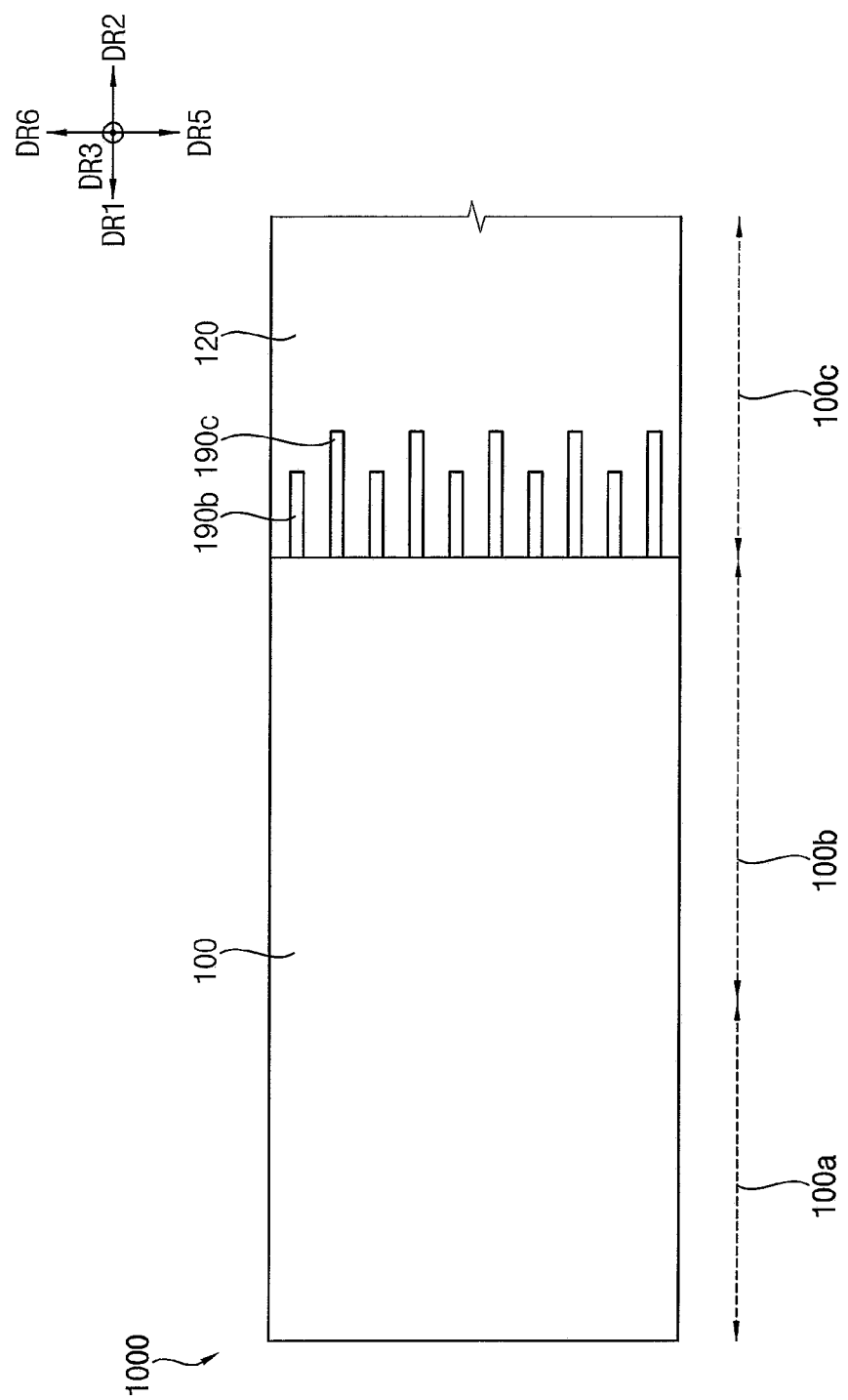

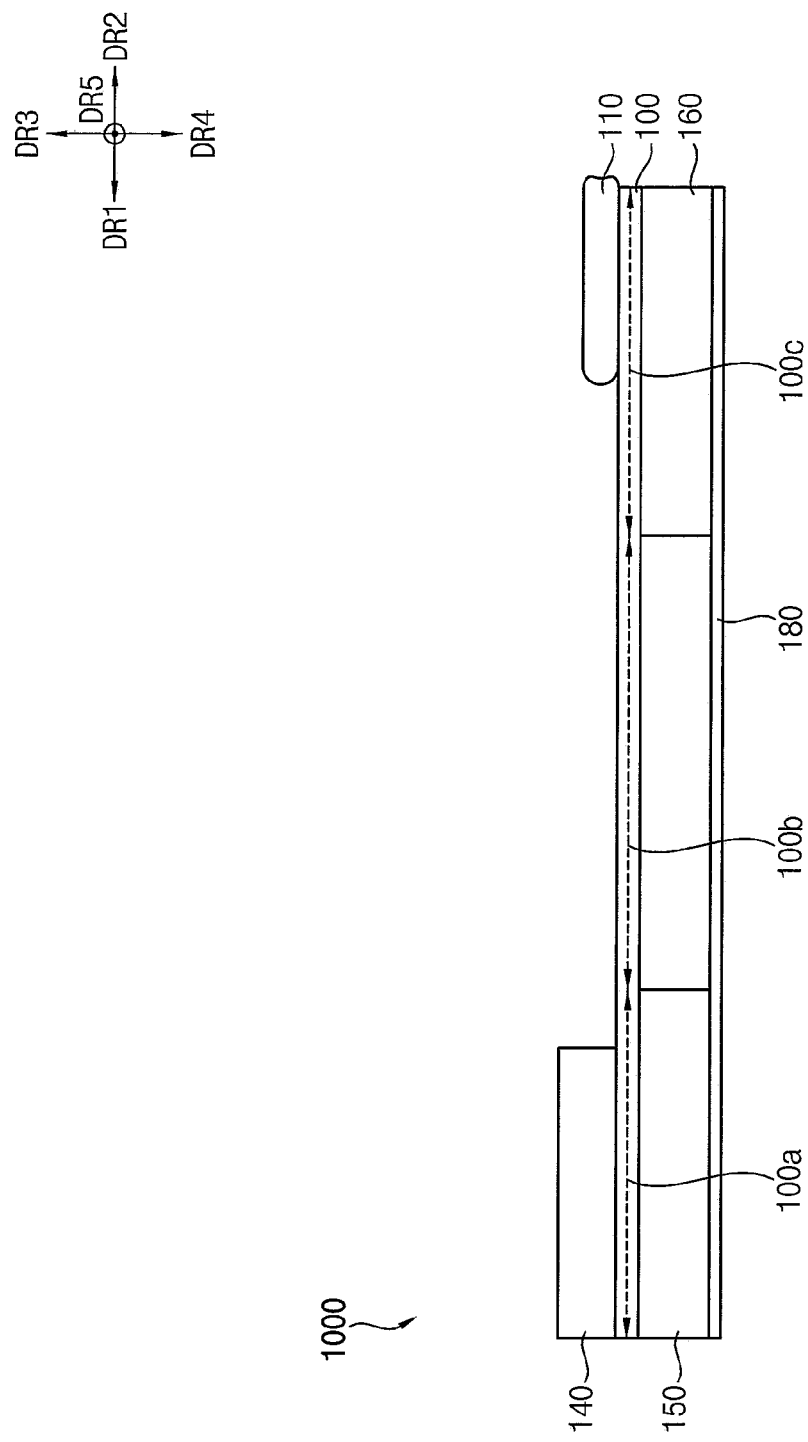

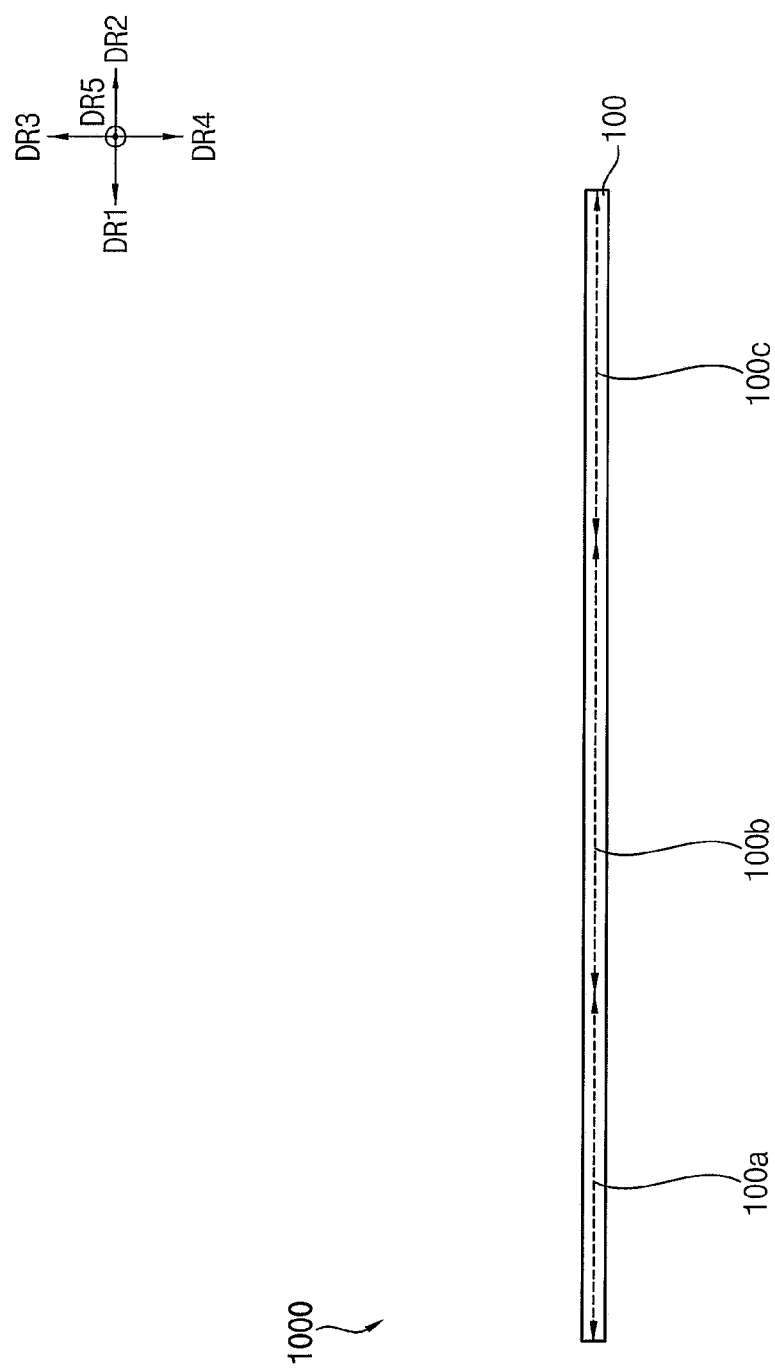

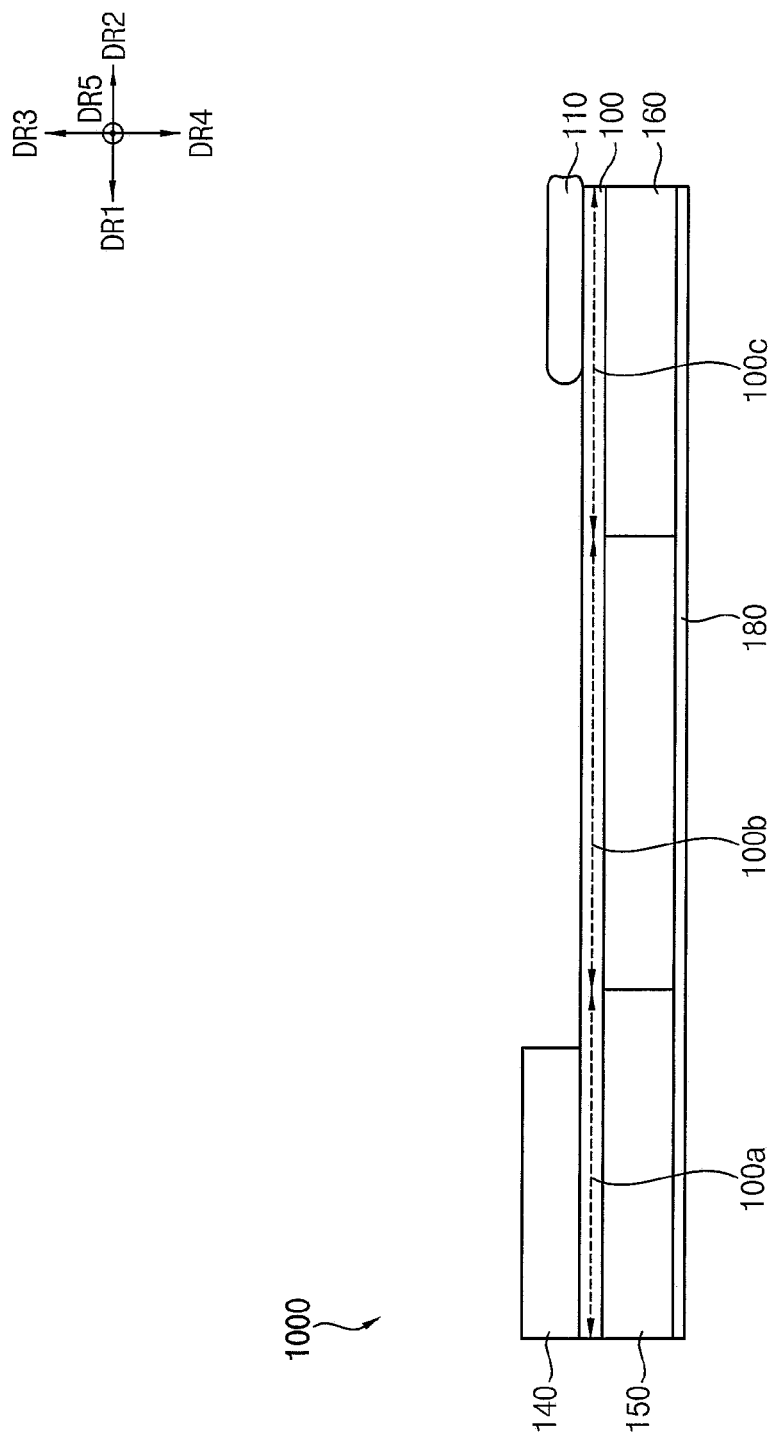

DISPLAY APPARATUS AND METHOD OF MANUFACTURING THE SAME

CROSS-REFERENCE TO RELATED APPLICATION

This application claims priority from and the benefit of Korean Patent Application No. 10-2019-0165370 filed on Dec. 12, 2019 which is hereby incorporated by reference for all purposes as if fully set forth herein.

BACKGROUND

Field

Exemplary embodiments of the invention relate generally to a display apparatus, and more particularly, to a display apparatus having a bending panel structure and a method for manufacturing the same.

Discussion of the Background

Recently, due to the development of technology, the display products are being produced which are more compact and lighter, yet more excellent in performance. A display apparatus has been developed into an organic light emitting display apparatus through a cathode ray tube, a plasma display apparatus and a liquid crystal display apparatus. Particularly, among the display apparatus used in mobile apparatus, a flexible organic light-emitting display apparatus having advantages of small size, light weight, and low power consumption has attracted attention.

The display apparatus adopts a bending structure in which an end portion of a display panel is bent to reduce dead space and bezel of the display apparatus. The display apparatus forms a protective layer for applying a resin as a means for protecting a flexible panel from cracks, vibrations, or impacts after or during the bending process.

The above information disclosed in this Background section is only for understanding of the background of the inventive concepts, and, therefore, it may contain information that does not constitute prior art.

SUMMARY

Applicant recognized that when the protective layer (e.g., a resin) is used for protecting the flexible panel, air bubbles are formed between the flexible panel and a circuit film such as a chip on film (COF) while the resin is disposed on a via portion of the chip on film (COF). The air bubbles may occur a VOID issue and cause a problem in bending of the display apparatus and inferior quality of the display apparatus.

Display apparatus constructed according to the principles and exemplary implementations of the invention and methods of manufacturing the display apparatus are capable of preventing the quality defect of the display apparatus by applying a circuit film having an opening to discharge air from the display apparatus without trapping the air. For example, the opening may be formed of a plurality of via holes or a plurality of slits so that air is not trapped in the display apparatus and to be discharged outside the display apparatus.

Additional features of the inventive concepts will be set forth in the description which follows, and in part will be apparent from the description, or may be learned by practice of the inventive concepts.

According to an aspect of the invention, a display apparatus includes: a flexible panel including a first non-bending area, a second non-bending area spaced apart from the first non-bending area, and a bending area between the first non-bending area and the second non-bending area, a circuit film having an opening at a first end of thereof and disposed on the second non-bending area of the flexible panel, an anisotropic conductive film disposed between the flexible panel and the circuit film, and a protective layer disposed on the bending area and covering at least a portion of the first end of the circuit film.

The first end of the circuit film may not overlap the anisotropic conductive film.

The protective layer may cover a portion of the opening.

The opening may include a plurality of via holes.

The plurality of via holes may be formed at about 2 to about 10 mm intervals.

The diameter of the plurality of via holes may be about 25 um or less.

The plurality of via holes may be arranged in a row from a portion where the protective layer covers the circuit film to a portion where the circuit film overlaps the protective layer (n is a natural number of 1 or more).

The opening may include a plurality of slits.

The plurality of slits may be formed at about 2 to about 10 mm intervals.

The plurality of slits may include a plurality of first slits, each having a first width and a first length, and a plurality of second slits, each having the first width and a second length different from the first length.

The display apparatus may further include a circuit board disposed on a second end opposite to the first end of the circuit film.

The display apparatus may further include a first substrate disposed on the flexible panel to overlap the first non-bending area of the flexible panel and a second substrate disposed on the flexible panel to overlap the second non-bending area of the flexible panel and spaced apart from the first substrate.

The display apparatus may further include a carrier film disposed on the first substrate, the second substrate and a space between the first substrate and the second substrate.

The display apparatus may further include an optical film disposed on the first non-bending area of the flexible panel.

The optical film may include a polarizing film.

The protective layer may include resin.

According to another aspect of the invention, a method for manufacturing a display apparatus, the method includes the steps of: preparing a flexible panel including a first non-bending area, a second non-bending area spaced apart from the first non-bending area, and a bending area between the first non-bending area and the second non-bending area, attaching a first substrate overlapping the first non-bending area of the flexible panel on the flexible panel, attaching a second substrate overlapping the second non-bending area of the flexible panel and being spaced apart from the first substrate on the flexible panel, attaching a carrier film on the first substrate, the second substrate and a space between the first substrate and the second substrate, attaching an optical film on the first non-bending area opposite to the first substrate of the flexible panel, disposing an anisotropic conductive film on the second non-bending area opposite to the second substrate of the flexible panel, forming an opening at a first end of a circuit film, disposing the circuit film on the anisotropic conductive film, and forming a protective layer disposed on the bending area and covering a portion of the first end of the circuit film.

The opening may include a plurality of via holes formed using a laser drill.

The opening may include a plurality of slits formed using a laser cut.

The protective layer may cover a portion of the opening.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 3 is a plan view of an exemplary embodiment of a part of the display apparatus of FIG. 2A.

FIG. 4 is a plan view of another exemplary embodiment of a part of the display apparatus of FIG. 2A.

FIG. 6 is a plan view of an exemplary embodiment of a part of the display apparatus of FIG. 5A.

FIG. 7 is a plan view of another exemplary embodiment of a part of the display apparatus of FIG. 5A.

FIGS. 8A to 8G are cross-sectional views illustrating a method for manufacturing the display apparatus shown in FIG. 2A.

FIGS. 9A to 9G are cross-sectional views illustrating a method for manufacturing the display apparatus shown in FIG. 5A.

DETAILED DESCRIPTION

Figure 1A:
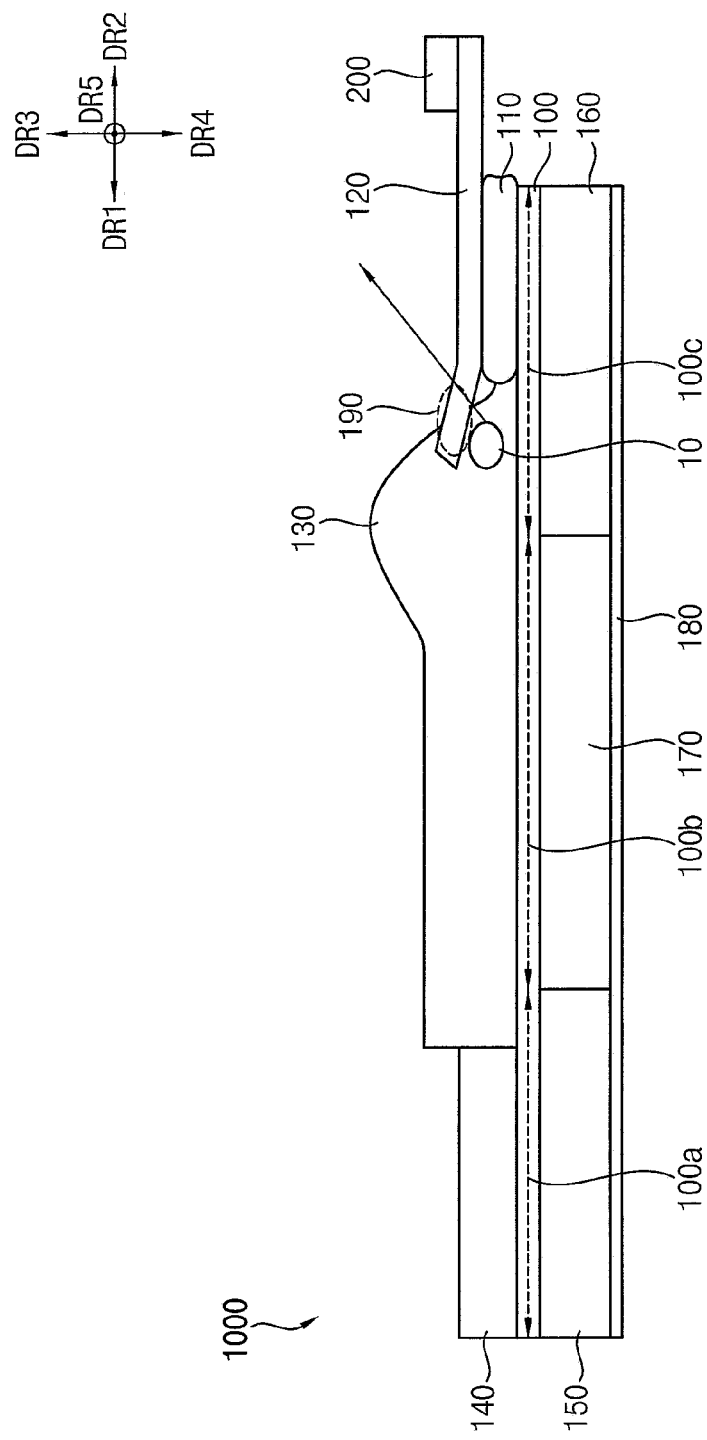
FIG. 1A is a cross sectional view of an exemplary embodiment of a display apparatus constructed according to the principles of the invention shown in an unbent state.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
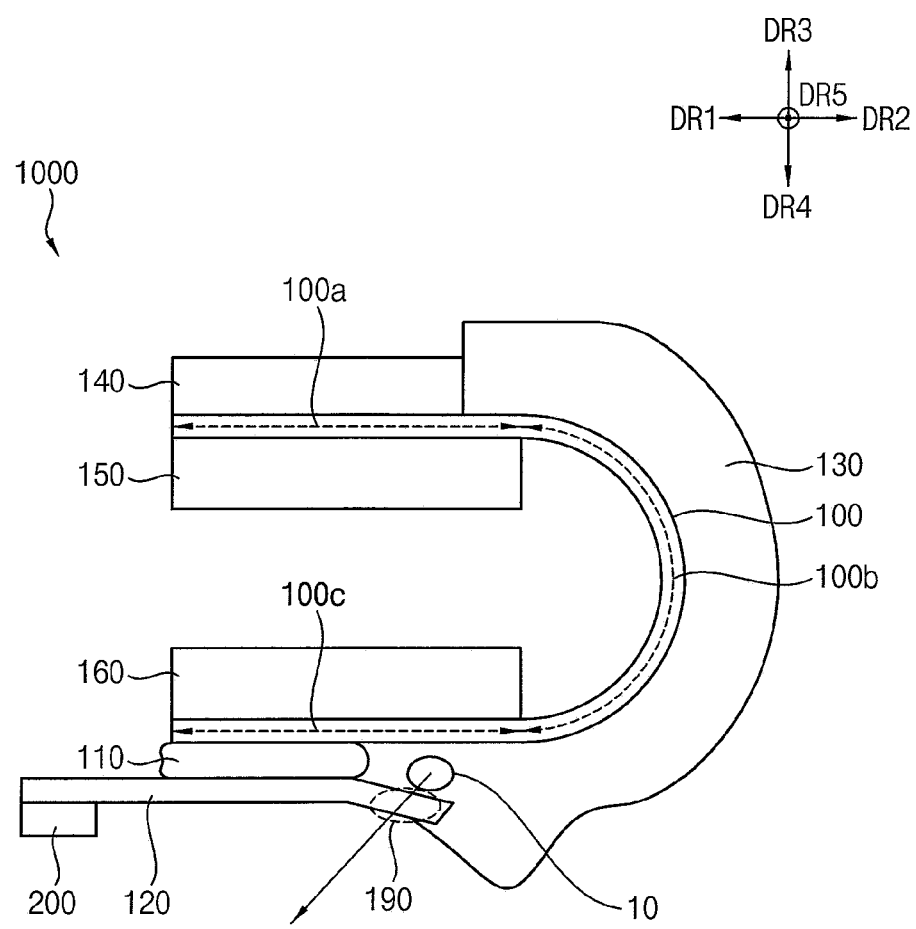
FIG. 1B is a cross sectional view of an exemplary embodiment of a display apparatus constructed according to the principles of the invention shown in a bent state.

FIGS. 1A and 1B are cross sectional views illustrating a display apparatus 1000 according to the principles of the invention. Specifically, FIG. 1A is a cross sectional view of an exemplary embodiment of a display apparatus shown in an unbent state. FIG. 1B is a cross sectional view of an exemplary embodiment of a display apparatus shown in a bent state.

Referring to FIGS. 1A and 1B, the display apparatus 1000 may include a flexible panel 100 including a first non-bending area 100a, a second non-bending area 100c spaced apart from the first non-bending area 100a and a bending area 100b between the first non-bending area 100a and the second non-bending area 100c, a circuit film 120 disposed on the second non-bending area 100c of the flexible panel 100, an anisotropic conductive film 110 disposed between the flexible panel 100 and the circuit film 120 on the second non-bending area 100c of the flexible panel 100 and a protective layer 130 disposed on the bending area 100b and covering at least a portion of a first end 190 of the circuit film 120. The circuit film 120 may have an opening through the circuit film 120 at the first end 190 of the circuit film 120.

As shown in FIG. 1B, when the flexible panel 100 is bent in a forth direction DR4, the flexible panel 100 receives a tensile force. For example, the flexible panel 100 is subjected to the greatest tensile force in the same direction as the bending direction (i.e., forth direction DR4), and the crack may be generated or propagated to other parts by itself or by external impact. The crack may cause disconnection in the display apparatus 1000. Therefore, the display apparatus 1000 may form the protective layer 130 to prevent the crack of the flexible panel 100. The protective layer 130 may be formed through various processes using various materials. In an exemplary embodiment, the protective layer 130 may include a resin. For example, the protective layer 130 may include an organic resin such as acrylic resin. The protective layer 130 may be formed by applying the organic resin by a jetting process and curing the organic resin applied on the flexible panel 100 with ultraviolet rays (UV). In the process of curing the organic resin applied on the flexible panel 100 with ultraviolet rays (UV), the volume of the protective layer 130 may be reduced.

An opening such as a plurality of via holes 190a shown in FIGS. 3 and 4 or a plurality of slits 190b and 190c shown in FIGS. 6 and 7 may be formed at the first end 190 of the circuit film 120 where the circuit film 120 contacts the protective layer 130. Accordingly, when the first end 190 contacts the anisotropic conductive film 110, the crack or the like may occur at the first end 190 of the circuit film 120. Accordingly, the first end 190 of the circuit film 120 may not overlap the anisotropic conductive film 110. Further, for example, the plurality of via holes formed at the first end 190 of the circuit film 120 may be used as a path for electricity. The protective layer 130 may be formed while covering the first end 190 of the circuit film 120 to protect the first end 190 of the circuit film 120 with an external impact. However, during the process of forming the protective layer 130, the display apparatus 1000 may trap air 10 between the first end 190 of the circuit film 120 and the flexible panel 100. In this case, an empty space may be generated in the display apparatus 1000 due to the trapped air 10. The trapped air 10 may cause poor quality, such as poor visibility and poor bending of the display apparatus 1000. According to the exemplary embodiment shown in FIGS. 1A and 1B, the opening penetrating through the first end 190 of the circuit film 120 does not trap the air 10 between the first end 190 of the circuit film 120, and may serve to allow the air 10 to be discharged to the outside of the display apparatus 1000, thereby a quality defect of the display apparatus 1000 may be prevented. On the circuit film 120, although not shown, an integrated circuit may be disposed. When the protective layer 130 covers all of the opening formed in the first end 190 of the circuit film 120, air 10 trapped between the first end 190 of the circuit film 120 and the flexible panel 100 may not be discharged through the opening. In this case, the air 10 is still trapped between the first end 190 of the circuit film 120 and the flexible panel 100 to cause the quality defect of the display apparatus 1000. Therefore, the protective layer 130 may cover a portion of the opening. That is, when the protective layer 130 covers only a portion of the opening, the air 10 may be discharged through the remaining portions excluding the portion to prevent quality defects of the display apparatus 1000.

The flexible panel 100 may include a flexible substrate, a thin film transistor, a plurality of insulating layers, a via insulating layer, a pixel defining layer, a light emitting structure, a thin film encapsulation layer, and the like. The thin film transistor may include an active pattern, a gate electrode, a source electrode, and a drain electrode. The light emitting structure may include a first electrode, a light emitting layer, and a second electrode. The display area of the flexible panel 100 can display an image by the light emitting structure.

The flexible substrate used to bend the bending area 100b may be made of a flexible material. For example, the flexible substrate may include polyethylene terephthalate (PET), polyethylene naphthalene (PEN), polypropylene (PP), polycarbonate (PC), polystyrene (PS), polysulfone (PSul), Polyethylene (PE), polyphthalamide (PPA), polyethersulfone (PES), polyarylate (PAR), polycarbonate oxide (PCO), modified polyphenyls Modified polyphenylene oxide (MPPO) and the like. In addition, when the display apparatus 1000 is implemented as a transparent display apparatus, the flexible substrate may be made of a transparent flexible material.

The flexible substrate may include a carbon component having excellent thermal conductivity, and may have excellent thermal conductivity characteristics. For example, the carbon component may include graphene, carbon nano tube, graphite, and the like. In addition, the flexible substrate may include graphite powder.

In an exemplary embodiment, the display apparatus 1000 may further include a first substrate 150 disposed on the flexible panel 100 to overlap the first non-bending area 100*a* of the flexible panel 100, the display apparatus 1000 may further include a second substrate 160 disposed on the flexible panel 100 to overlap the second non-bending area 100*c* of the flexible panel 100 and spaced apart from the first substrate 150. Accordingly, there may be a space 170 between the first substrate 150 and the second substrate 160. The first substrate 150 and the second substrate 160 may be made of a transparent resin substrate. Examples of the transparent resin substrate that can be used as the first substrate 150 and the second substrate 160 include a polyimide substrate. In this case, the polyimide substrate may include a first polyimide layer, a barrier film layer, a second polyimide layer, and the like. In other exemplary embodiments, the first substrate 150 and the second substrate 160 may include quartz substrates, synthetic quartz substrates, calcium fluoride substrates, fluorine doped, an F-doped quartz substrate, a sodalime glass substrate, a non-alkali glass substrate, and the like. The space 170 between the first substrate 150 and the second substrate 160 is shown in a rectangular shape; the space 170 may have a trapezoidal shape in which a length of the side of the fourth direction DR4 is longer than a length of the side of the third direction DR3. Conversely, the space 170 may have a trapezoidal shape in which the length of the side of the fourth direction DR4 is shorter than the length of the side of the third direction DR3.

In an exemplary embodiment, the display apparatus 1000 may further include a carrier film 180 disposed on the first substrate 150, the second substrate 160 and the space 170 between the first substrate 150 and the second substrate 160. The carrier film 180 may prevent external materials (e.g., dust, oxygen, moisture, etc.) from contacting the flexible panel 100. When the external material contacts the flexible panel 100, the light emitting structure may be damaged. That is, when the external material contacts with the flexible panel 100, the quality defect of the display apparatus 1000 may be caused. The carrier film 180 may be removed later. For example, FIG. 1B shows the display apparatus 100 in which the carrier film 180 is removed. In an exemplary embodiment, the display apparatus 1000 may further include a circuit board 200 disposed on a second end in a direction opposite to the first end 190 of the circuit film 120. The circuit board 200 may transmit an electric signal received from the outside to the flexible panel 100. The electrical signal may be transmitted to the display area of the display apparatus 1000, and the light emitting structure may display an image on the display apparatus 1000 due to the thin film transistor of the display area receiving the electrical signal. Although not shown, a new protective layer for protecting the second end may also be formed on the second end of the circuit film 120 on which the circuit board 200 is disposed on the circuit film 120. For example, the circuit board 200 may be a flexible printed circuit board (FPCB).

In an exemplary embodiment, the display apparatus 1000 may further include an optical film 140 disposed on the first non-bending area 100*a* of the flexible panel 100. In an exemplary embodiment, the optical film 140 may be a polarizing film. The polarizing film may be used to more accurately represent a black screen of an organic light emitting display apparatus, unlike the role of a polarizing film for LCD used in a liquid crystal display (LCD), and the polarizing film used in the organic light emitting display apparatus may be used to improve outdoor visibility of the organic light emitting display apparatus by preventing reflection of external light. However, this is exemplary, and various types of films may be used as the optical film 140 according to purposes.

When forming the protective layer 130 by the jetting process, the protective layer 130 may cover only a part of the first end 190 of the circuit film 120. However, the optical film 140 disposed on the flexible panel 100 may not be covered. For example, when the protective layer 130 covers the polarizing film used in the organic light emitting display apparatus, the polarizing film used in the organic light emitting display apparatus may not prevent reflection of external light, and thus the polarizing film may not achieve the purpose of improving outdoor visibility. However, this is exemplary, and the protective layer 130 may cover a portion of the optical film 140 for reasons such as an error occurring in the process. In addition, air is trapped between the optical film 140 and the protective layer 130 to cause the quality defect of the display apparatus 1000.

FIG. 1B illustrates the display apparatus 1000 in a state in which the bending area 100*b* of the flexible panel 100 is bent. Components arranged in the second direction DR2 of the bending area 100*b* based on the bending area 100*b* of the flexible panel 100 of FIG. 1A may be bent in the fourth direction DR4. When the bending area 100*b* is bent, a semicircle having a radius of about 0.3 mm may be formed in the bent portion. If the protective layer 130 is not formed, when the display apparatus 1000 is bent, excessive tensile stress or the like may be applied to a connection wiring of the display apparatus 1000. This is because a location of the connecting wiring may not correspond to a stress neutral plane. However, when the protective layer 130 is formed, a thickness and modulus of the protective layer 130 may be adjusted. The display apparatus 1000 may adjust a position of the stress neutral plane in an object including the flexible panel 100, the connection wiring, and the protective layer 130. Therefore, by placing the stress neutral plane in the vicinity of the connection wiring through the protective layer 130, the tensile stress applied to the connection wiring can be minimized to protect the bending area 100*b* of the flexible panel 100.

Figure 2A:
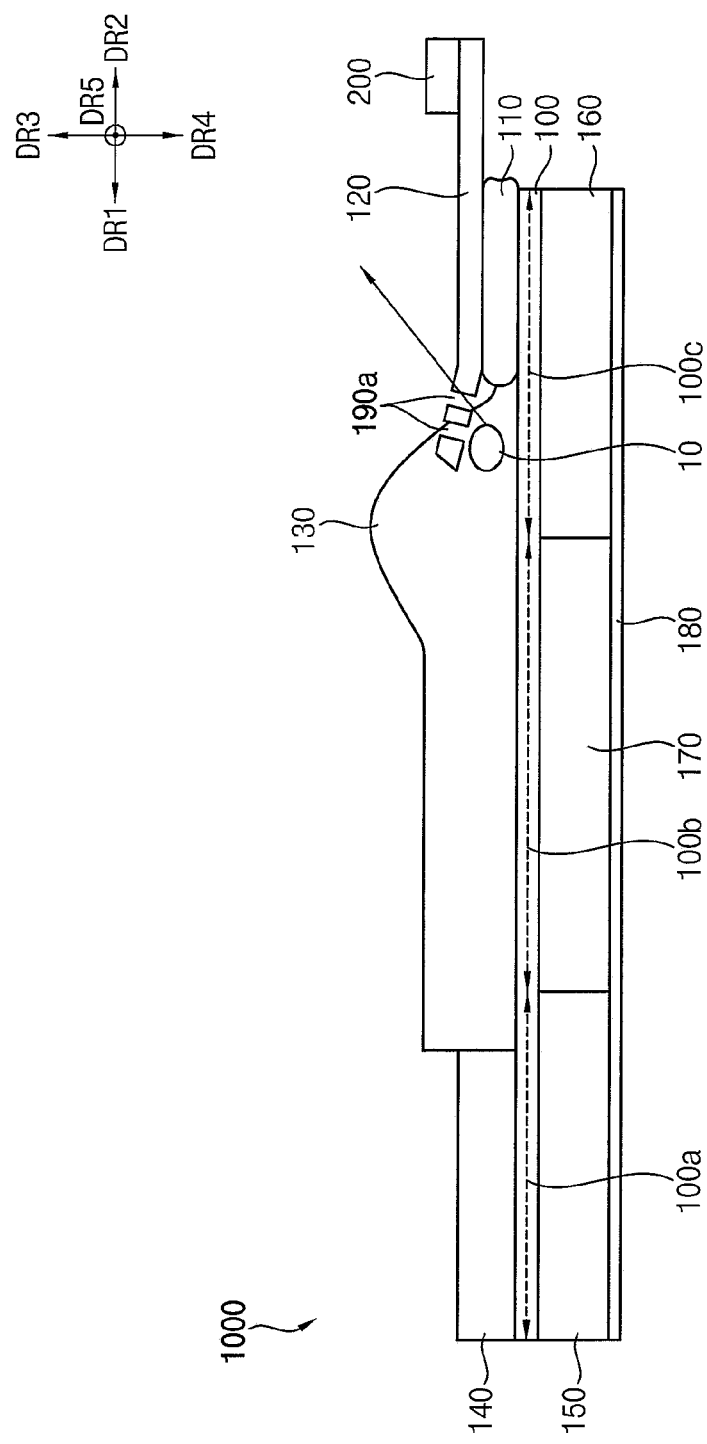
FIGS. 2A and 2B are cross sectional views of an exemplary embodiment of some portions of the display apparatus of FIG. 1A.
Figure 2B:
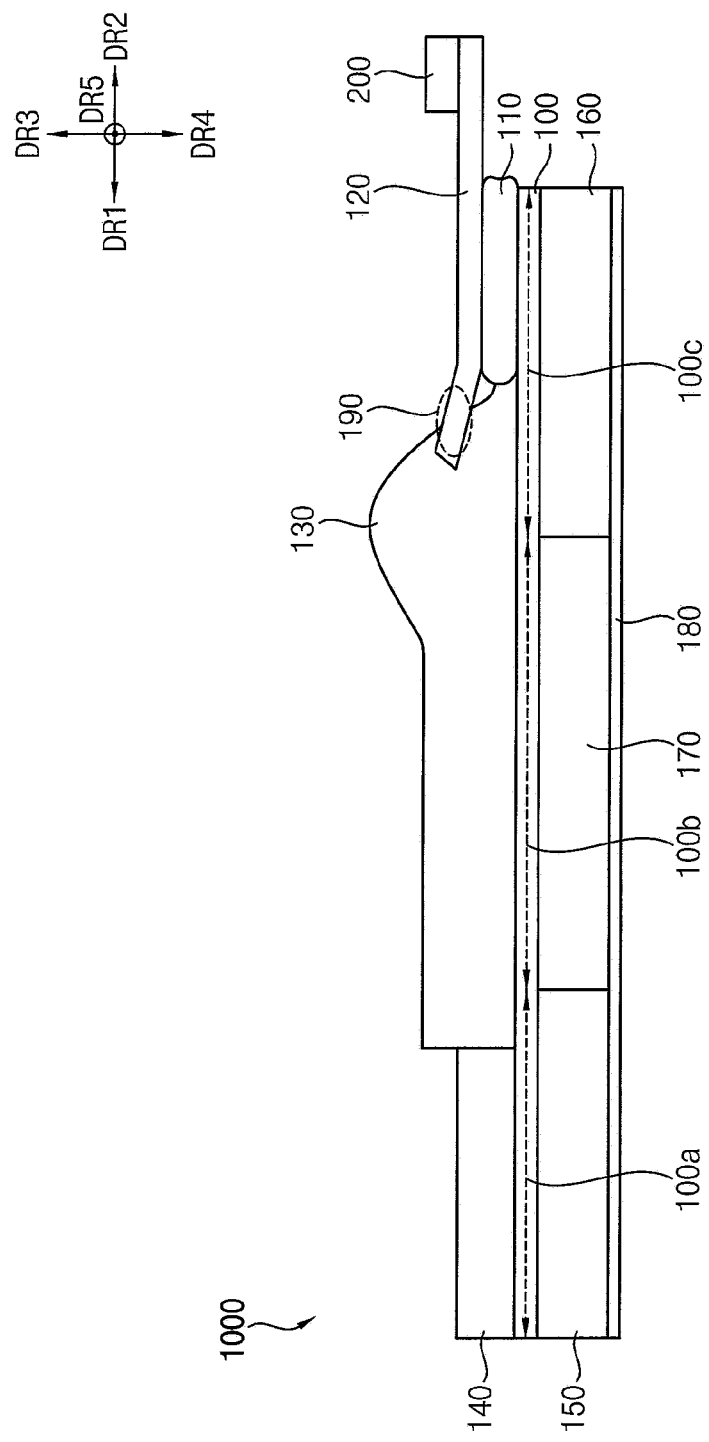

FIGS. 2A and 2B are cross sectional views of an exemplary embodiment of some portions of the display apparatus of FIG. 1A, and FIG. 3 is a plan view of an exemplary embodiment of a part of the display apparatus of FIG. 2A, and FIG. 4 is a plan view of another exemplary embodiment of a part of the display apparatus of FIG. 2A.

Referring to FIGS. 2A, 3 and 4, the opening formed in the first end 190 of the circuit film 120 may be a plurality of via holes 190*a*. FIG. 2A is a cross sectional view of a portion of the display apparatus 1000 of FIG. 1A formed by cutting a plurality of via holes 190*a*. Therefore, the plurality of via holes 190*a* shown in FIG. 2A may serve to allow the air 10 to be discharged to the outside of the display apparatus 1000 without being trapped between the first end 190 of the circuit film 120 and the flexible panel 100 when the protective layer 130 is formed. The plurality of via holes formed at the first end 190 of the circuit film 120 may be formed to be used as the passage for electricity. Separately, the display apparatus 1000 may allow the air 10 to be discharged to the outside of the display apparatus 1000 without being trapped between the first end 190 of the circuit film 120 and the flexible panel 100 by forming the plurality of via holes 190a. In FIG. 2A, the plurality of via holes 190a are illustrated as being formed in two rows, but this is exemplary, and the plurality of via holes 190a may be arranged in n rows (n is a natural number of 1 or more). FIG. 3 illustrates the display apparatus 1000 in which the plurality of via holes 190a are formed in a row at the first end 190 of the circuit film 120. FIG. 4 illustrates the display apparatus 1000 in which the plurality of via holes 190a are formed in two rows at the first end 190 of the circuit film 120 is illustrated. In an exemplary embodiment, the plurality of via holes 190a may be arranged in a row from a portion where the protective layer 130 covers the circuit film 120 to a portion where the circuit film 120 overlaps the protective layer 130 (n is a natural number of 1 or more). This is exemplary, and the plurality of via holes 190a may be arranged in various forms within a range capable of achieving a purpose of not trapping the air 10 between the first end 190 of the circuit film 120 and the flexible panel 100. For example, the plurality of via holes 190a may be arranged in a zigzag shape. However, when the plurality of via holes 190a are formed at dense intervals, when the circuit film 120 is subjected to an external impact, a quality defect of the circuit film 120 can be easily caused. Therefore, the plurality of via holes 190a may be formed at intervals of about 2 to about 10 mm. In addition, a diameter of the plurality of via holes 190a may be about 25 um or less. FIGS. 3 and 4, the plurality of via holes 190a are illustrated as having a circular shape, but this is exemplary, and the shape of the plurality of via holes 190a may be formed in various shapes including a square, a triangle, a rhombus and the like within a range that can achieve the purpose of preventing the are 10 from being trapped between the first end 190 of the circuit film 120 and the flexible panel 100. FIG. 2B is a cross-sectional view illustrating a portion in which the plurality of via holes 190a are not formed in the display apparatus 1000 of FIG. 1A. Although the display apparatus 1000 of FIG. 2B is illustrated as the opening formed at the first end 190 of the circuit film 120 is blocked, the display apparatus 1000 may allow the air 10 to be discharged through the plurality of via holes 190a without being trapped between the first end 190 of the circuit film 120 and the flexible panel 100.

Figure 5A:
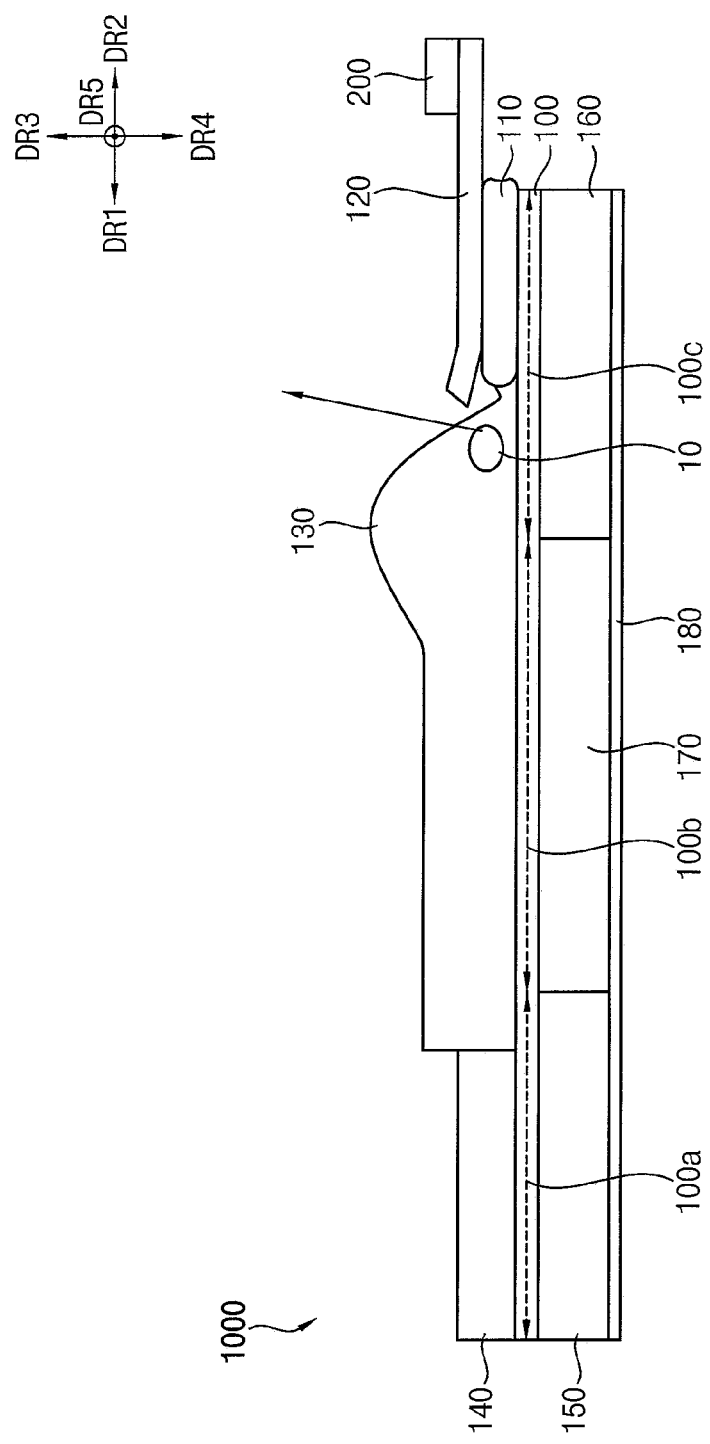
FIGS. 5A and 5B are cross-sectional of another exemplary embodiment of some portions of the display apparatus of FIG. 1A.
Figure 5B:
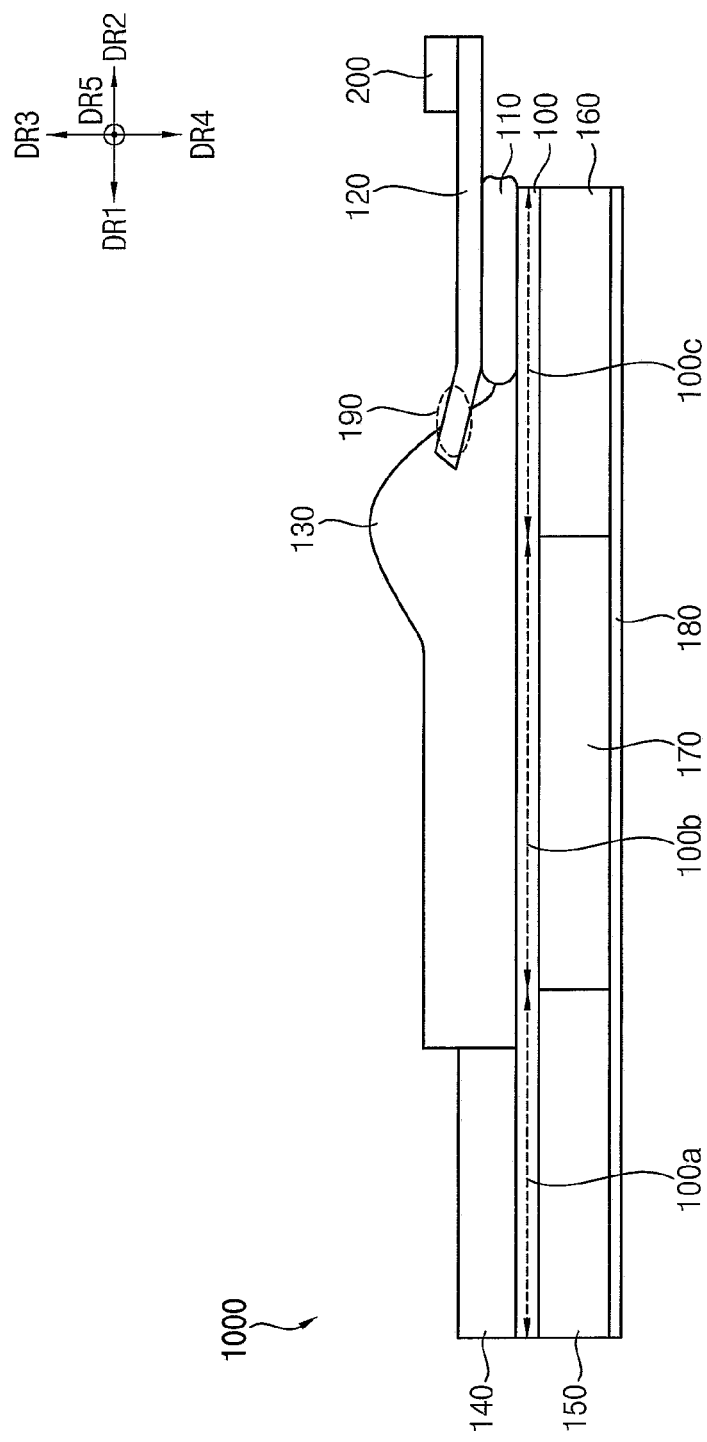

FIGS. 5A and 5B are cross-sectional of another exemplary embodiment of some portions of the display apparatus of FIG. 1A, and FIG. 6 is a plan view of an exemplary embodiment of a part of the display apparatus of FIG. 5A, and FIG. 7 is a plan view of another exemplary embodiment of a part of the display apparatus of FIG. 5A.

Referring to FIGS. 5A, 6 and 7, the opening formed in the first end 190 of the circuit film 120 may be a plurality of slits 190b and 190c. FIG. 5A is a cross-sectional view illustrating a portion of the display apparatus 1000 of FIG. 1A formed by cutting a plurality of slits 190b and 190c. Therefore, it may appear that there is no configuration at the first end 190 of the circuit film 120 in which the opening is formed. The plurality of slits 190b and 190c may allow air 10 to be discharged outside without being trapped between the first end 190 of the circuit film 120 and the flexible panel 100. When the protective layer 130 covers all of the slits 190b and 190c, the air 10 may not be discharged outside the display apparatus 1000 and may be trapped between the first end 190 of the circuit film 120 and the flexible panel 100. Therefore, the protective layer 130 may cover only a portion of the plurality of slits 190b and 190c. When the plurality of slits 190b and 190c are formed at dense intervals, when the circuit film 120 is subjected to an external impact, the defect of the circuit film 120 can be easily caused. Therefore, the plurality of slits 190b and 190c may be formed at intervals of about 2 to about 10 mm.

Referring to FIG. 7, the plurality of slits 190b and 190c may include a plurality of first slits 190b and a plurality of second slits 190c. The plurality of first slits 190b may have a first width and a first length. The plurality of second slits 190c may have a second width and a second length different from the first length. When the protective layer 130 covers all the first slits 190b in the process of forming the protective layer 130, in order to allow the air 10 to be discharged outside the display apparatus 1000 without being trapped between the first end 190 of the circuit film 120 and the flexible panel 100, the opening of the first end 190 may further include the plurality of slits 190c having the second length, which is longer than the first slits 190b. However, this is exemplary, and the opening may further include various slits having a different width from the first width or a length different from the first length and the second length. In addition, the opening may be formed in a different shape from the slits indicated by a straight line (for example, a diagonal line). The opening may be formed in various shapes without limitation within a range that serves to prevent trapping of the air 10 between the first end 190 of the circuit film 120 and the flexible panel 100. FIG. 5B is a cross-sectional view illustrating the display apparatus 1000 of FIG. 1A, in which the plurality of slits 190b and 190c are not formed. Although the display apparatus 1000 of FIG. 5B is illustrated as the opening formed at the first end 190 of the circuit film 120 is blocked, the display apparatus 1000 may allow the air 10 to be discharged through the plurality of slits 190b and 190c without being trapped between the first end 190 of the circuit film 120 and the flexible panel 100.

As such, the display apparatus 1000 may include the flexible panel 100 including the first non-bending area 100a, the second non-bending area 100c spaced apart from the first non-bending area 100a and the bending area 100b between the first non-bending area 100a and the second non-bending area 100c, the circuit film 120 disposed on the second non-bending area 100c of the flexible panel 100, the anisotropic conductive film 110 disposed between the flexible panel 100 and the circuit film 120 on the second non-bending area 100c of the flexible panel 100, the protective layer 130 formed on the bending area 100b and covering the portion of the first end 190 of the circuit film 120, and the circuit film 120 may have the opening passing through the circuit film 120 at the first end 190 of the circuit film 120. Here, the opening may be formed of the plurality of via holes 190a as shown in FIGS. 3 and 4 or the plurality of slits 190b and 190c as shown in FIGS. 6 and 7 so that the air 10 is not trapped in the display apparatus 1000 and be discharged outside the display apparatus 1000. Accordingly, it is possible to prevent occurring the quality defect of the display apparatus 1000.

FIGS. 8A to 8G are cross-sectional views illustrating a method for manufacturing the display apparatus shown in FIG. 2A.

Figure 8A:
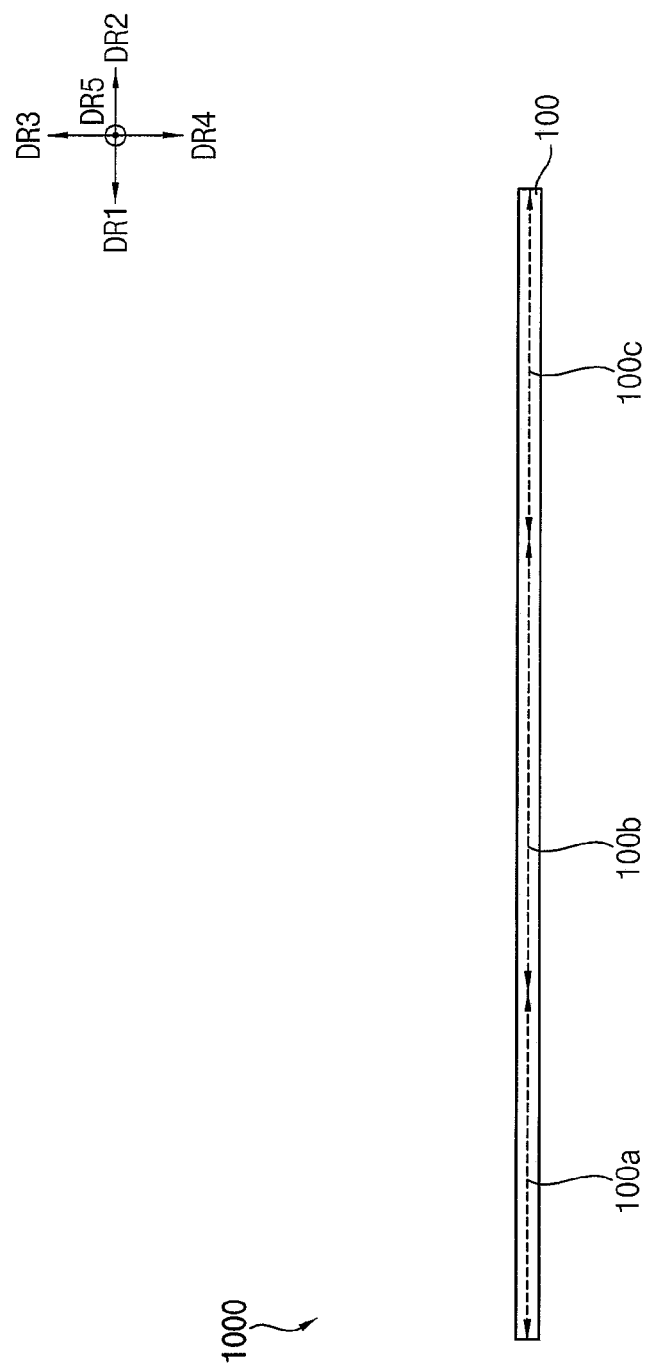
Figure 8B:
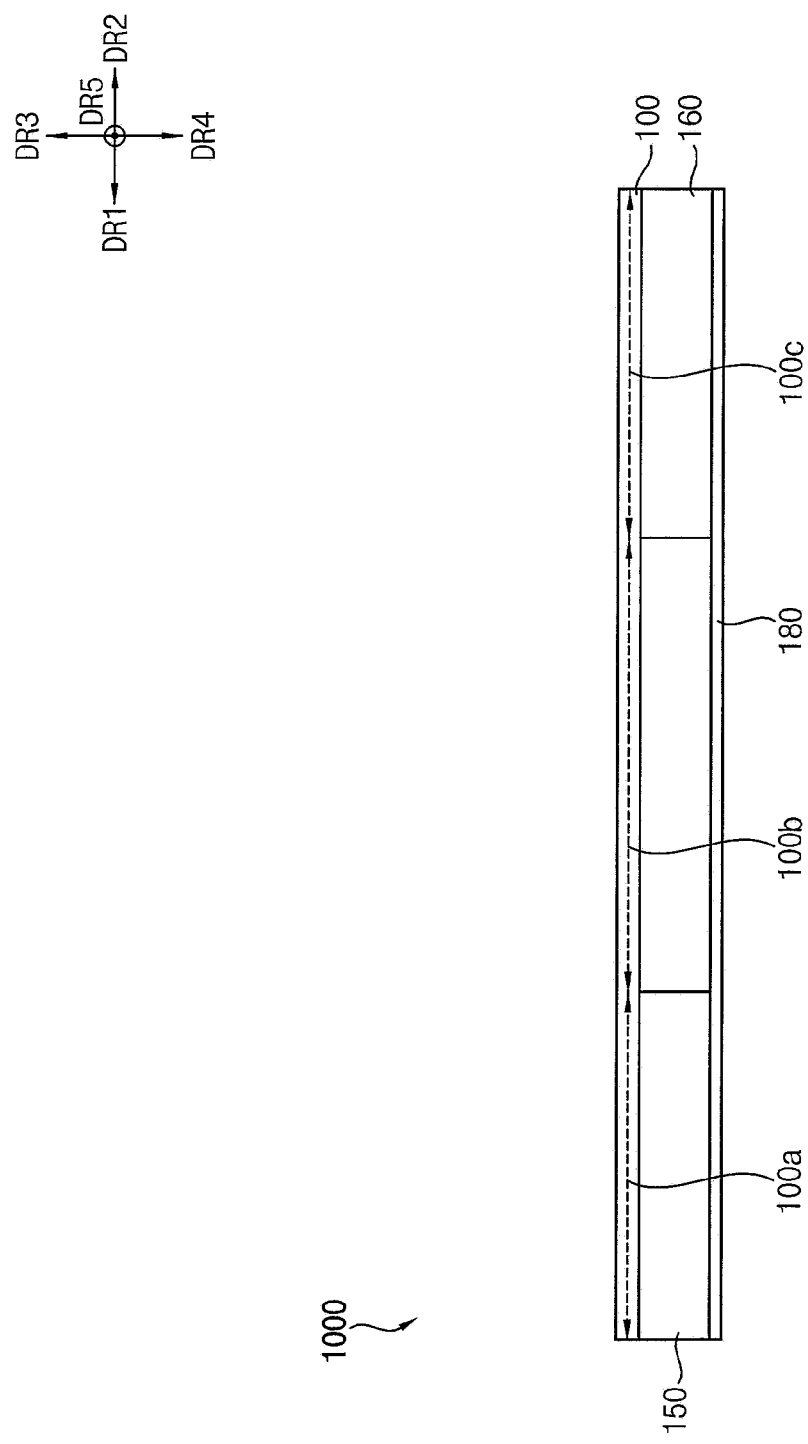
Figure 8D:
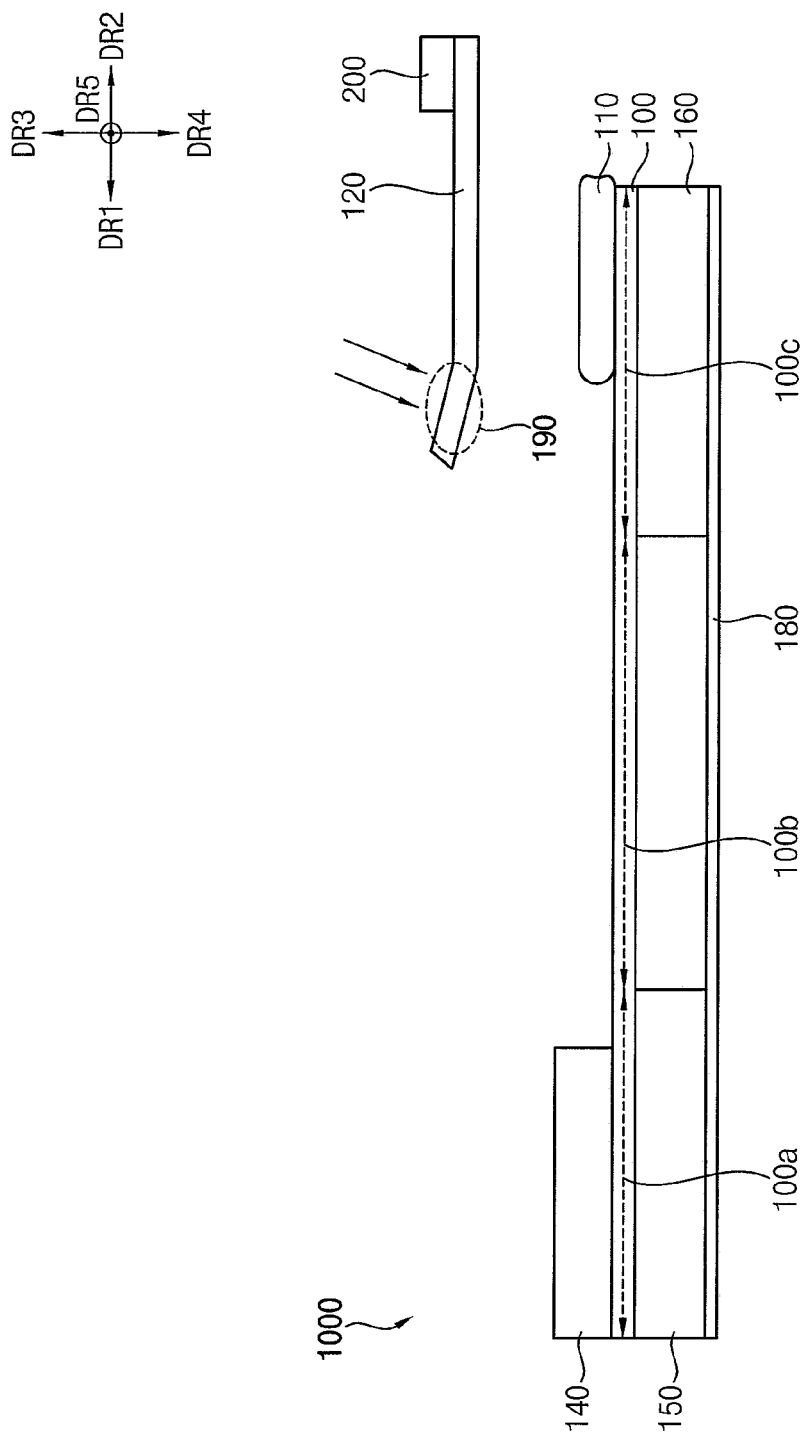
Figure 8E:
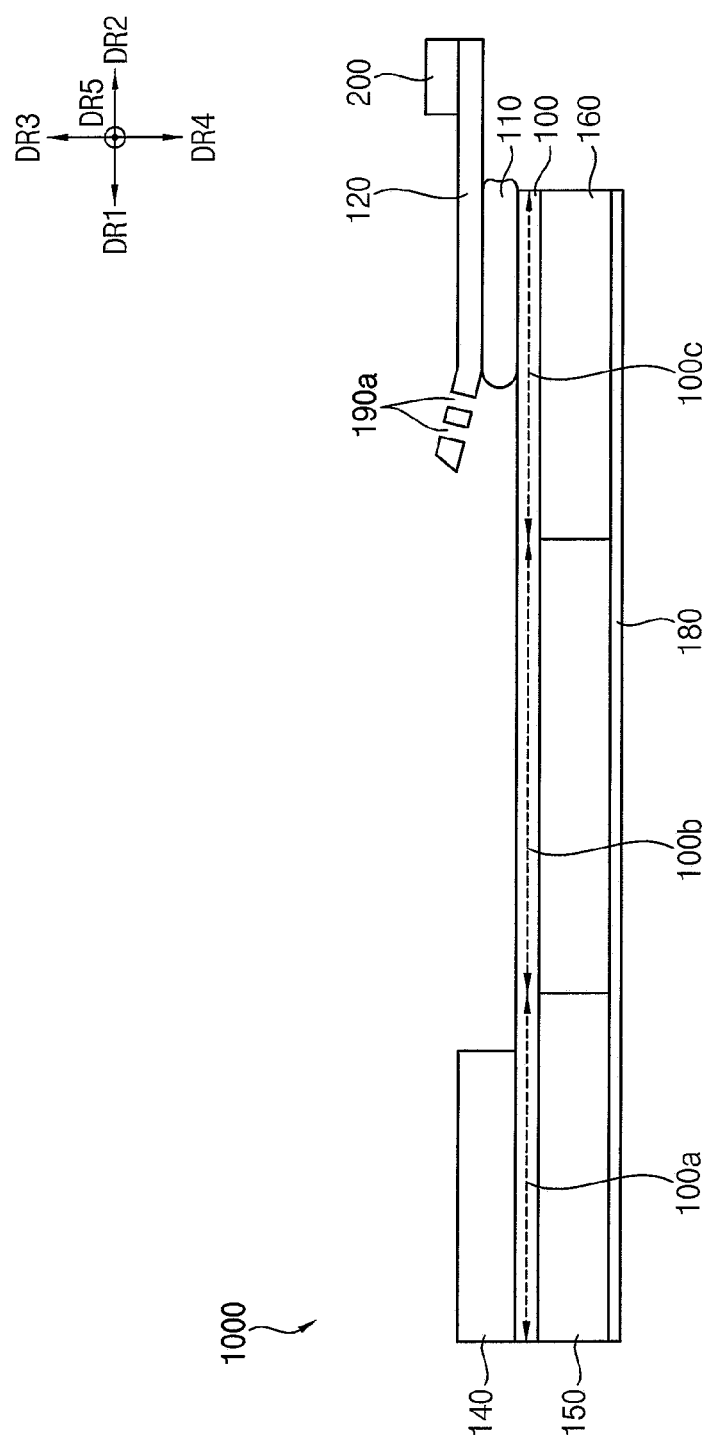
Figure 8F:
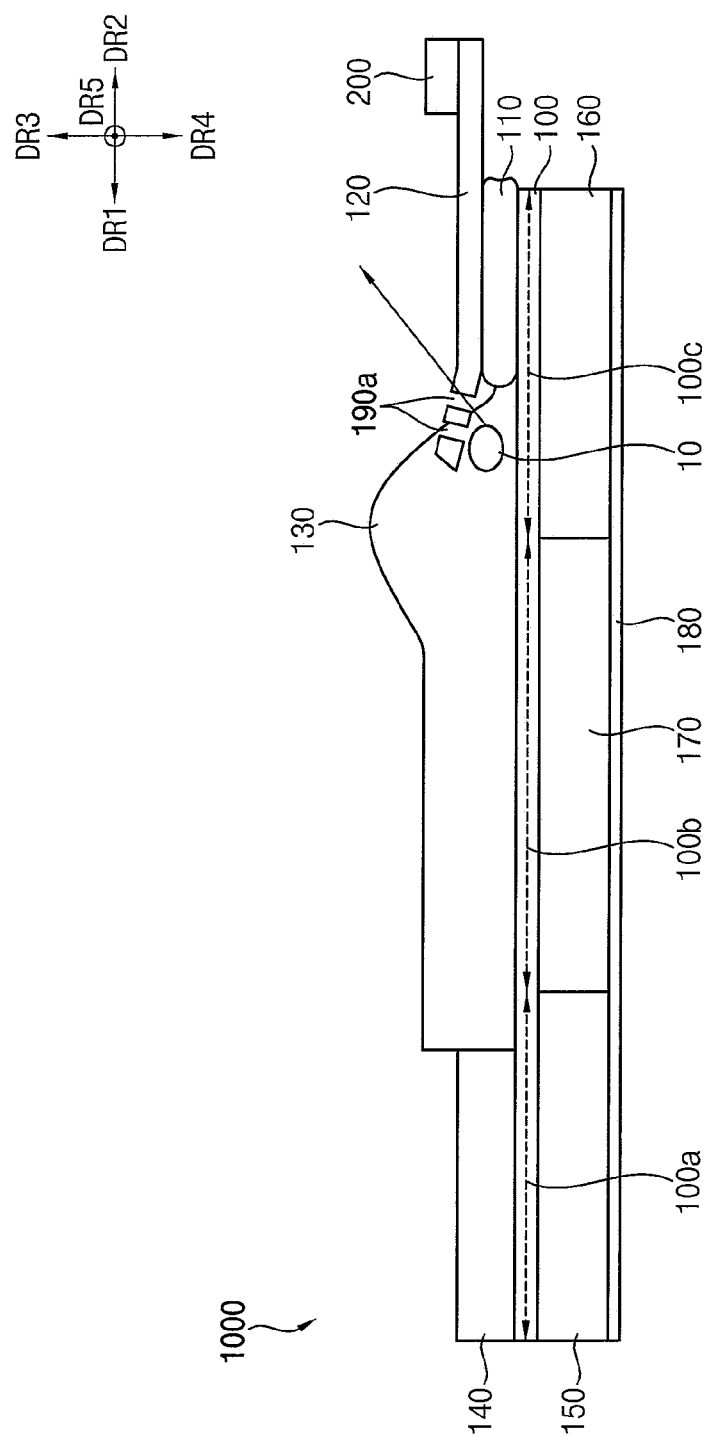

Referring to FIGS. 2A and 8A to 8G, the method for manufacturing the display apparatus may include the steps of preparing the flexible panel 100 including the first non-bending area 100a, the second non-bending area 100c spaced apart from the first non-bending area 100a and the bending area 100b between the first non-bending area 100a and the second non-bending area 100c as shown in FIG. 8A, attaching the first substrate 150 overlapping the first non-bending area 100a of the flexible panel 100 on the flexible panel 100, attaching the second substrate 160 overlapping the second non-bending area 100c of the flexible panel 100 and being spaced apart from the first substrate 150 on the flexible panel 100, attaching the carrier film 180 on the first substrate 150, the second substrate 160 and the space 170 between the first substrate 150 and the second substrate 160 as shown in FIG. 8B, attaching the optical film 140 on the first non-bending area 100a opposite to the first substrate 150 of the flexible panel 100, disposing the anisotropic conductive film 110 on the second non-bending area 100c opposite to the second substrate 160 of the flexible panel 100 as shown in FIG. 8C, forming the opening through the circuit film 120 at a first end 190 of the circuit film 120, disposing the circuit film 120 on which the opening (e.g., via holes shown in FIG. 8E) is formed on the anisotropic conductive film 110 as shown in FIGS. 8D and 8E, and forming the protective layer 130 disposed on the bending area 100b and covering the portion of the first end 190 of the circuit film 120 as shown in FIG. 8F.

In an exemplary embodiment, the opening may be the plurality of via holes 190a of FIG. 8E formed using a laser drill. The protective layer 130 may be formed after the circuit film 120 on which the opening is formed is disposed on the flexible panel 100 by the anisotropic conductive film 110. If the protective layer 130 is not formed, when the display apparatus 1000 is bent, excessive tensile stress or the like may be applied to a connection wiring of the display apparatus 1000. This is because a location of the connecting wiring may not correspond to a stress neutral plane. However, when the protective layer 130 is formed, a thickness and modulus of the protective layer 130 may be adjusted. The display apparatus 1000 may adjust a position of the stress neutral plane in an object including the flexible panel 100, the connection wiring, and the protective layer 130. Therefore, by placing the stress neutral plane in the vicinity of the connection wiring through the protective layer 130, the tensile stress applied to the connection wiring can be minimized to protect the bending area 100b of the flexible panel 100. The protective layer 130 may be formed by applying a liquid or paste type material and curing it. For example, the protective layer 130 may include the organic resin such as acrylic resin. In addition, the protective layer 130 may prevent the external material from contacting the flexible panel 100. The flexible panel 100 may be prevented from contacting the external material by the protective layer 130 and the carrier film 180. In addition, the protective layer 130 may protect the bending area 100b from external force, impact, and subsequent manufacturing processes.

A length of the first direction DR1 of the portion where the plurality of via holes 190a are formed at the first end 190 of the circuit film 120 may be about 1000 um. A portion where the protective layer 130 covers the plurality of via holes 190a formed in the first end 190 may be about 300 to about 600 um. However, this is exemplary, and the protective layer 130 may be variously formed within a range that allows the air 10 to be discharged through the opening formed in the first end 190 without being trapped between the first end 190 of the circuit film 120 and the flexible panel 100. Through this, the display apparatus 1000 may allow the air 10 to be discharged to the outside of the display apparatus 1000 without trapping air between the first end 190 of the circuit film 120 and the flexible panel 100, and the quality defect of the display apparatus 1000 may be prevented.

Figure 8G:
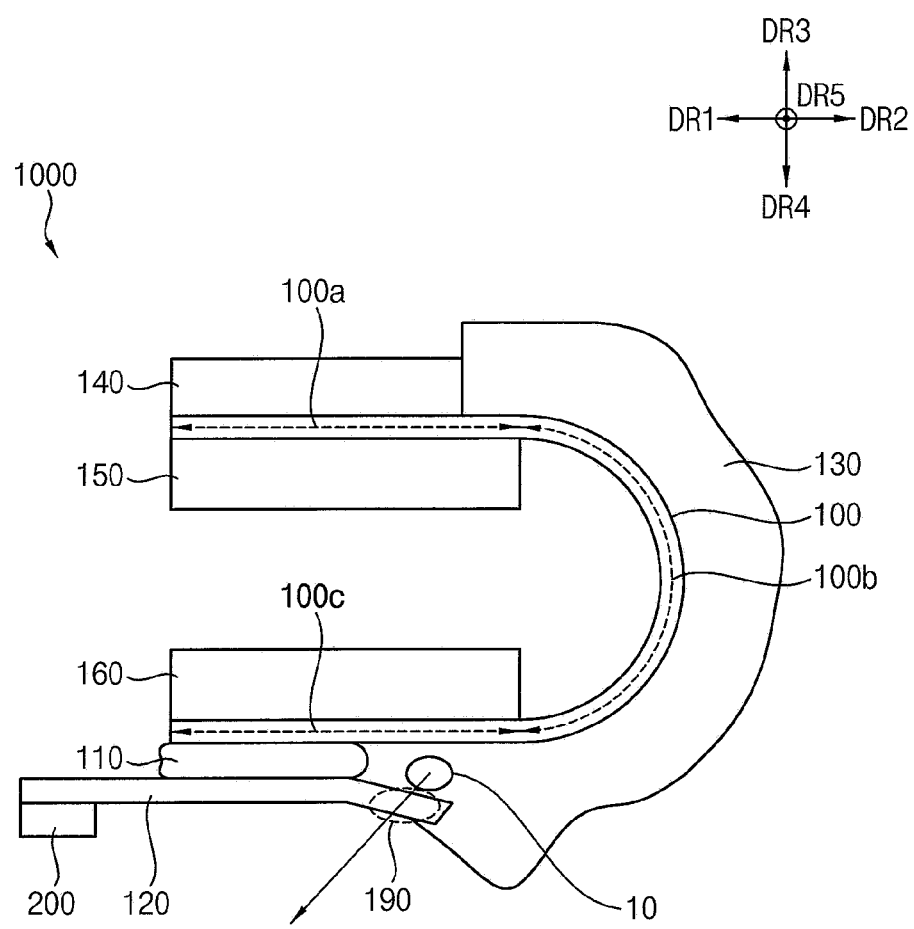

FIG. 8G is a view illustrating a portion in which a plurality of via holes 190a are not formed in the display apparatus 1000.

FIGS. 9A to 9G are cross-sectional views illustrating a method for manufacturing the display apparatus shown in FIG. 5A. The manufacturing method may be substantially the same as the manufacturing method of the display apparatus of FIGS. 8A to 8G except that the plurality of slits 190b and 190c shown in FIGS. 6 and 7 are formed in the opening. Therefore, repeated description is omitted.

Figure 9B:
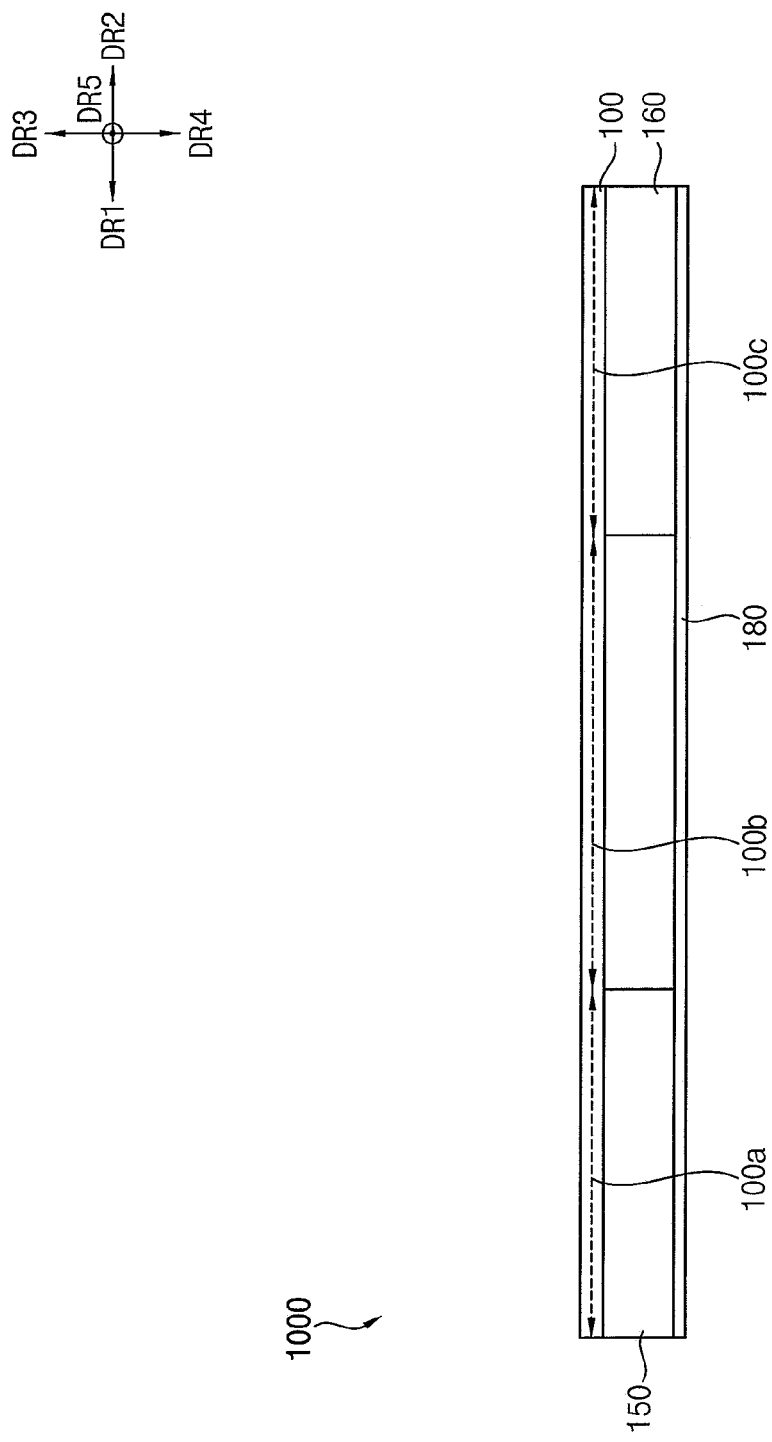
Figure 9D:
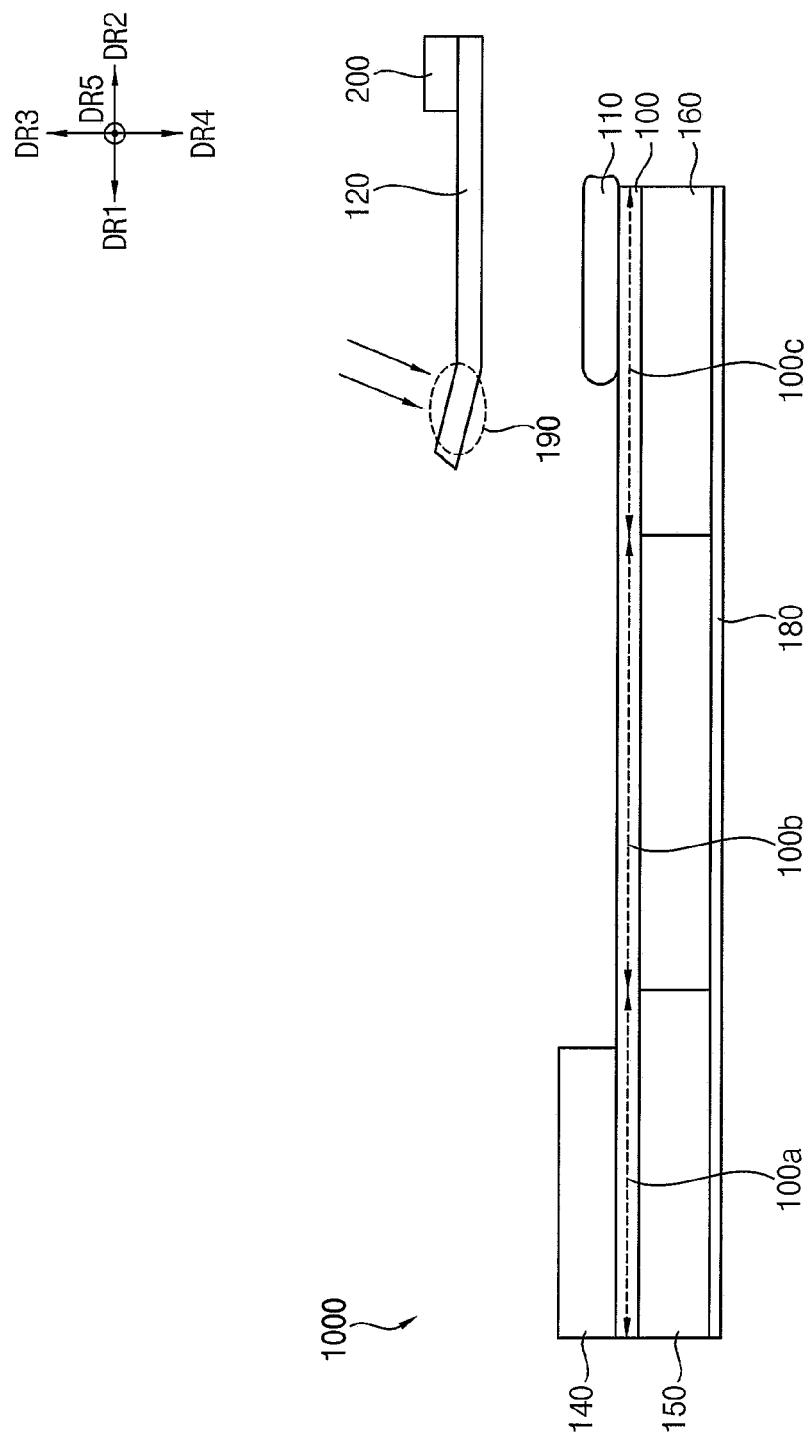
Figure 9E:
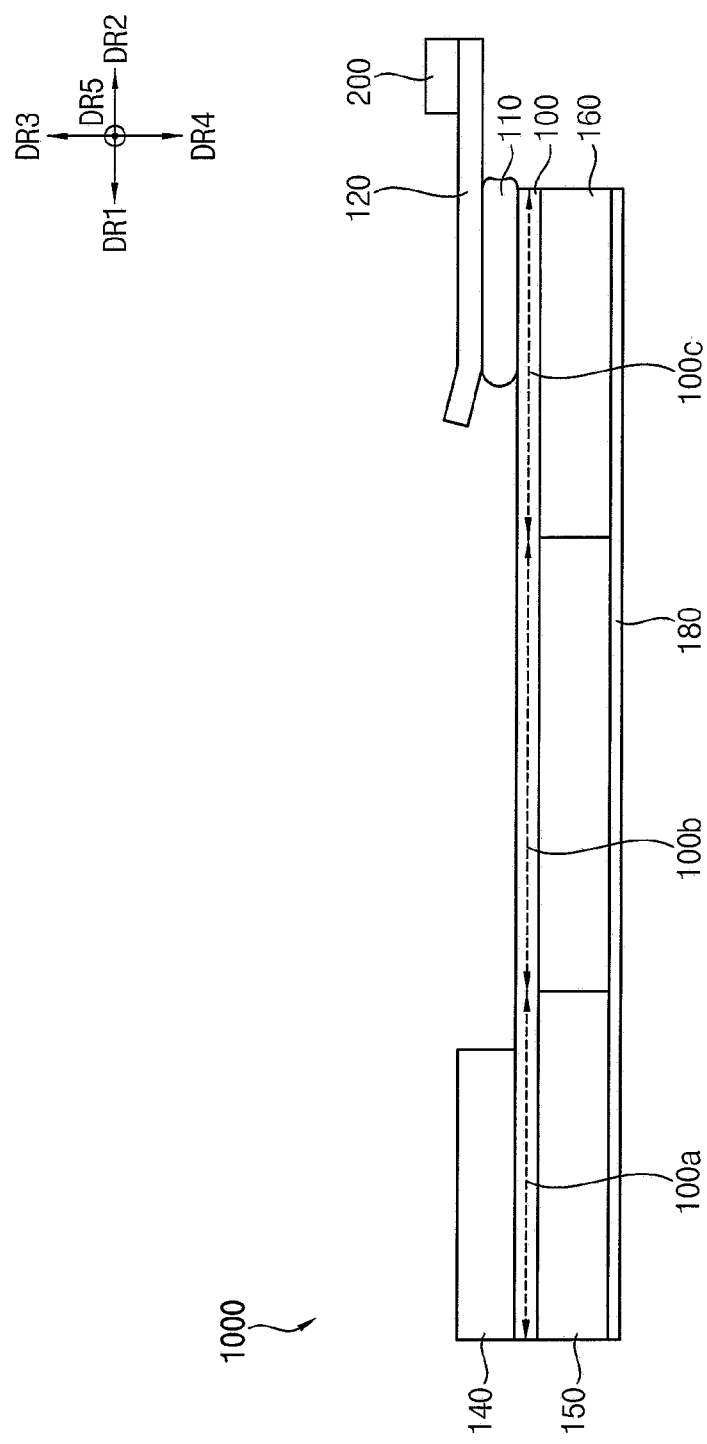
Figure 9F:
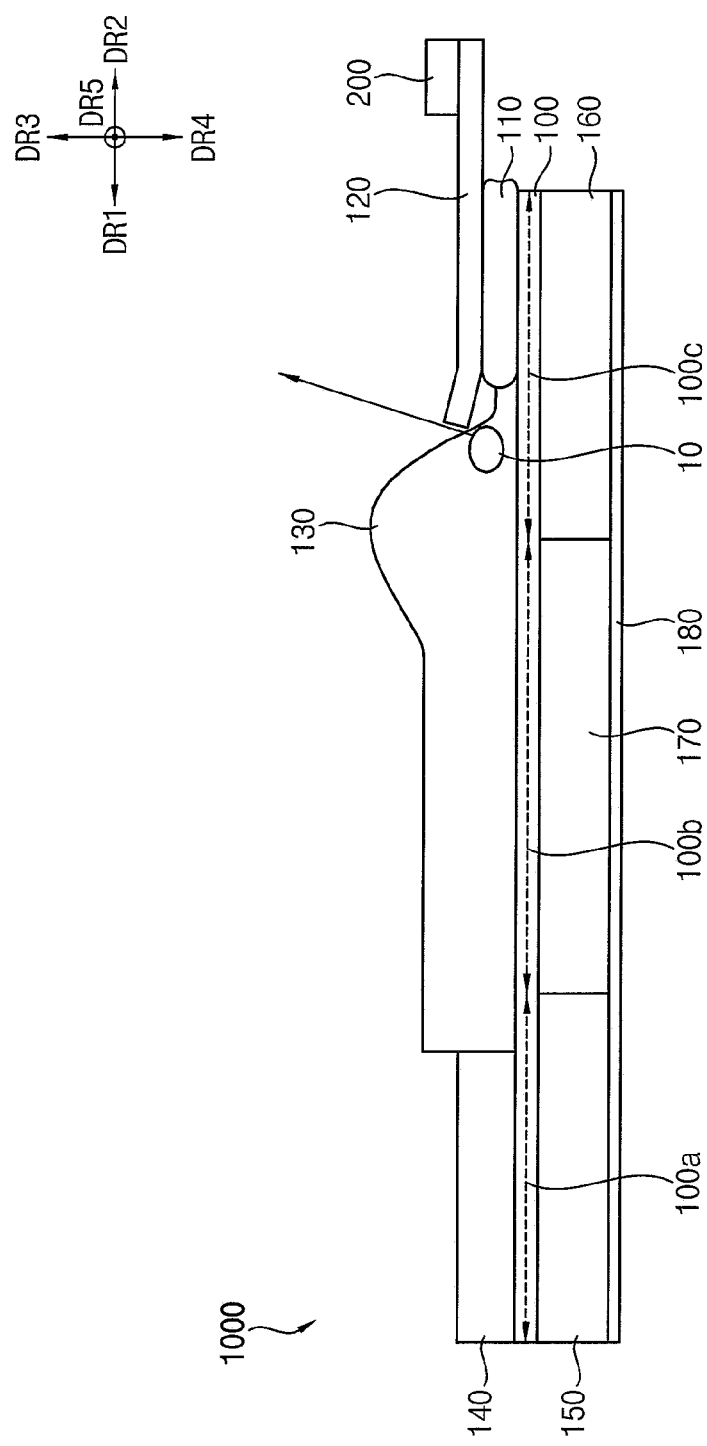
Figure 9G:
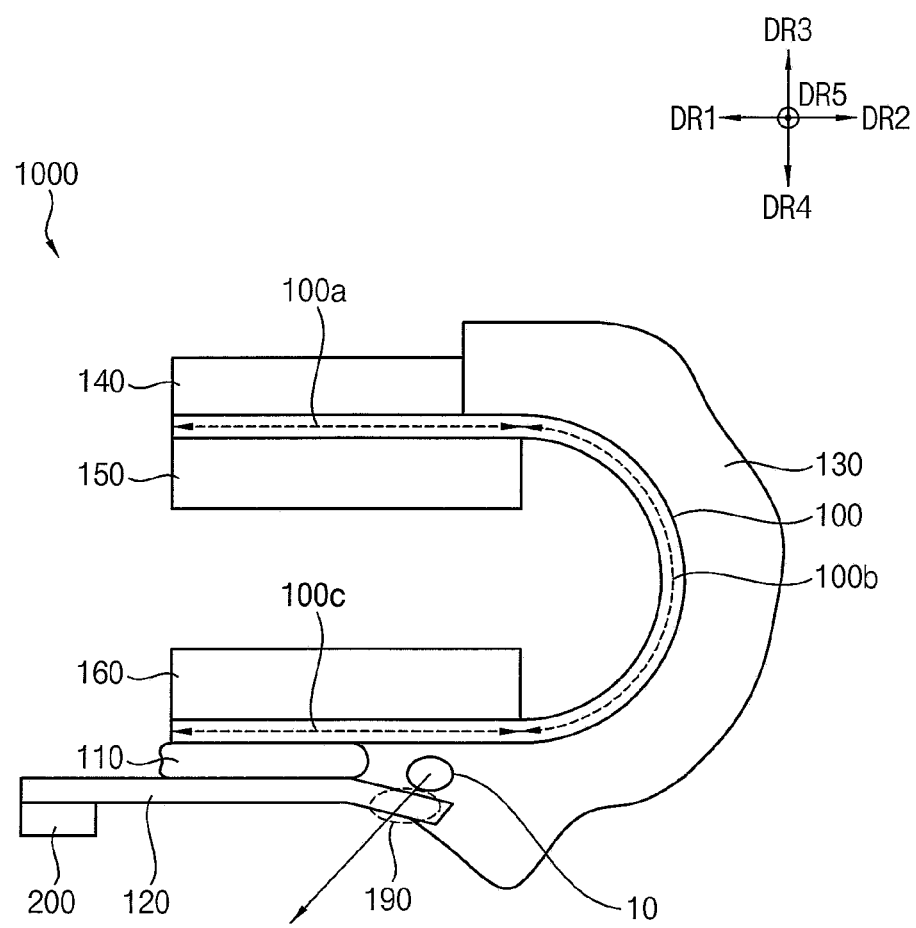

Referring to FIGS. 5A and 9A to 9G, since the manufacturing method for the display apparatus 1000 of FIGS. 9A to 9G is a cross-sectional view of a portion in which a plurality of slits 190b and 190c are formed, the first end 190 of the circuit film 120 is shown as an empty space. When the space between the plurality of slits 190b and 190c is cut, the first end 190 of the circuit film 120 may not be an empty space. In an exemplary embodiment, the opening may be a plurality of slits 190b and 190c shown in FIGS. 6 and 7 formed using a laser cut. A length of the first direction DR1 of the portion where the plurality of slits 190b and 190c are formed at the first end 190 of the circuit film 120 may be about 1000 um. The portion where the protective layer 130 covers the plurality of slits 190a formed in the first end 190 may be about 300 to about 600 um. However, this is exemplary, and the protective layer 130 may be variously formed within a range that allows the air 10 to be discharged through the opening formed in the first end 190 without being trapped between the first end 190 of the circuit film 120 and the flexible panel 100. FIG. 9G is a view illustrating a portion in which a plurality of slits 190b and 190c are not formed in the display apparatus 1000.

Through this, the display apparatus 1000 may allow the air 10 to be discharged to the outside of the display apparatus 1000 without trapping air between the first end 190 of the circuit film 120 and the flexible panel 100, and the quality defect of the display apparatus 1000 may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
   a flexible panel including a first non-bending area, a second non-bending area spaced apart from the first non-bending area, and a bending area between the first non-bending area and the second non-bending area;
   a circuit film having an opening at a first end of thereof and disposed on the second non-bending area of the flexible panel, the opening including a plurality of via holes;
   an anisotropic conductive film disposed between the flexible panel and the circuit film; and
   a protective layer disposed on the bending area and covering at least a portion of the first end of the circuit film.

2. The display apparatus of claim 1, wherein the first end of the circuit film does not overlap the anisotropic conductive film.

3. The display apparatus of claim 1, wherein the protective layer covers a portion of the opening.

4. The display apparatus of claim 1, wherein the plurality of via holes are formed at about 2 to about 10 mm intervals.

5. The display apparatus of claim 1, wherein the diameter of the plurality of via holes is about 25 um or less.

6. The display apparatus of claim 1, wherein the plurality of via holes are arranged in a row from a portion where the protective layer covers the circuit film to a portion where the circuit film overlaps the protective layer (n is a natural number of 1 or more).

7. The display apparatus of claim 1, wherein the opening comprises a plurality of slits.

8. The display apparatus of claim 7, wherein the plurality of slits are formed at about 2 to about 10 mm intervals.

9. The display apparatus of claim 7, wherein the plurality of slits include a plurality of first slits, each having a first width and a first length, and a plurality of second slits, each having the first width and a second length different from the first length.

10. The display apparatus of claim 1, further comprising:
a circuit board disposed on a second end opposite to the first end of the circuit film.

11. The display apparatus of claim 1, further comprising:
a first substrate disposed on the flexible panel to overlap the first non-bending area of the flexible panel; and
a second substrate disposed on the flexible panel to overlap the second non-bending area of the flexible panel and spaced apart from the first substrate.

12. The display apparatus of claim 11, further comprising:
a carrier film disposed on the first substrate, the second substrate and a space between the first substrate and the second substrate.

13. The display apparatus of claim 1, further comprising:
an optical film disposed on the first non-bending area of the flexible panel.

14. The display apparatus of claim 13, wherein the optical film comprises a polarizing film.

15. The display apparatus of claim 1, wherein the protective layer includes resin.

16. A method for manufacturing a display apparatus, comprising the steps of:
preparing a flexible panel including a first non-bending area, a second non-bending area spaced apart from the first non-bending area, and a bending area between the first non-bending area and the second non-bending area;
attaching a first substrate overlapping the first non-bending area of the flexible panel on the flexible panel;
attaching a second substrate overlapping the second non-bending area of the flexible panel and being spaced apart from the first substrate on the flexible panel;
attaching a carrier film on the first substrate, the second substrate and a space between the first substrate and the second substrate;
attaching an optical film on the first non-bending area opposite to the first substrate of the flexible panel;
disposing an anisotropic conductive film on the second non-bending area opposite to the second substrate of the flexible panel;
forming an opening at a first end of a circuit film;
disposing the circuit film on the anisotropic conductive film; and
forming a protective layer disposed on the bending area and covering a portion of the first end of the circuit film.

17. The method of claim 16, wherein the opening comprises a plurality of via holes formed using a laser drill.

18. The method of claim 16, wherein the opening comprises a plurality of slits formed using a laser cut.

19. The method of claim 16, wherein the protective layer covers a portion of the opening.

* * * * *